US008890730B2

(12) United States Patent
Lowney et al.

(10) Patent No.: US 8,890,730 B2
(45) Date of Patent: Nov. 18, 2014

(54) CALIBRATION OF A SWITCHING INSTANT OF A SWITCH

(71) Applicant: Xilinx, Inc., San Jose, CA (US)

(72) Inventors: Donnacha Lowney, Dublin (IE); Christophe Erdmann, Dublin (IE); Edward Cullen, Clane (IE)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/843,909

(22) Filed: Mar. 15, 2013

(65) Prior Publication Data

US 2014/0266824 A1 Sep. 18, 2014

(51) Int. Cl.
*H03M 1/10* (2006.01)
(52) U.S. Cl.
CPC .................................. *H03M 1/1009* (2013.01)
USPC ........... 341/120; 375/226; 455/303; 341/118; 341/141; 341/169; 341/170
(58) Field of Classification Search
CPC ............ H03M 1/1004; H03M 1/1215; H03M 1/1085; H03M 1/1038
USPC ................. 341/118, 120, 141, 155, 169, 170; 375/226; 455/303
See application file for complete search history.

(56) References Cited

U.S. PATENT DOCUMENTS

| | | | |
|---|---|---|---|
| 4,903,024 A * | 2/1990 | Evans et al. .................... | 341/120 |
| 6,081,215 A * | 6/2000 | Kost et al. ...................... | 341/120 |
| 6,473,013 B1 * | 10/2002 | Velazquez et al. ............. | 341/120 |
| 6,717,536 B2 * | 4/2004 | Jonsson ......................... | 341/120 |
| 6,784,815 B2 * | 8/2004 | Jonsson ......................... | 341/120 |
| 7,049,984 B2 * | 5/2006 | Wood et al. .................... | 341/120 |
| 7,227,479 B1 * | 6/2007 | Chen et al. ..................... | 341/118 |
| 7,466,252 B1 | 12/2008 | Radulov et al. | |
| 7,782,235 B1 * | 8/2010 | Velazquez ...................... | 341/118 |
| 2003/0146863 A1 * | 8/2003 | Jonsson ......................... | 341/120 |
| 2003/0169192 A1 * | 9/2003 | Jonsson ......................... | 341/118 |

OTHER PUBLICATIONS

Cheng, L. et al., "A Cancellation Technique for Output-Dependent Delay Differences in High-Accuracy DACs", 2012, pp. 1104-1107.
NXP, DAC1627D1G25, Objective data sheet, Dual 16-bit DAC, LVDS interface, up to 1.25 Gsps, x2,x4 and x8 interpolating, Rev. 1, Apr. 29, 2011, 1-69 pgs.
Tang, Y, et al., "A 14b 200MS/s DAC with SFDR.78dBc, IM3<83dBc and NSD<-163dBm/Hz across the whole Nyquist Band enabled by Dynamic-Mismatch Mapping", 2010 Symposium on VLSI Circuits/ Technical Digest of Technical Papers, 2010, pp. 151-152.

(Continued)

*Primary Examiner* — Lam T Mai
(74) *Attorney, Agent, or Firm* — W. Eric Webostad

(57) ABSTRACT

An apparatus for calibration of a signal converter is disclosed. This apparatus includes a first digital-to-analog converter ("DAC") and a calibration system coupled to an output port of the first DAC. The calibration system includes a second DAC. The calibration system is configured to provide an adjustment signal responsive to a spurious spectral performance parameter in an output of the first DAC. The spurious spectral performance parameter is sensitive to a timing error associated with the first DAC. The calibration system is coupled to provide the adjustment signal to the first DAC to correct the timing error of the first DAC.

20 Claims, 14 Drawing Sheets

(56) References Cited

OTHER PUBLICATIONS

Tang, Y, et al., "A 14b 200MS/s DAC with SFDR.78dBc, IM3<83dBc and NSD<-163dBm/Hz across the whole Nyquist Band enabled by Dynamic-Mismatch Mapping", IEEE Journal of Solid-State Circuits, vol. 46, No. 6, Jun. 2011, pp. 1371-1381.

SRS830 amplifier, http://thinksrs.com/downloads/PDFs/Manuals/SR830m.pdf, pp. 3-1 to 3-2, Rev. 2.5, Oct. 2011.

Catteau, B. et al., An On-Line Calibration Technique for Mismatch Errors in High-Speed DACs, IEEE Transactions on Circuits and Systems I: Regular Papers, IEEE, US, vol. 55, No. 7, Aug. 1, 2008, pp. 1873-1883.

Chao Su et al., "Dynamic calibration of Current-Steering DAC" 2006 IEEE International Symposium on Circuits and Systems, May 21-24, 2006, ISCAS 2006, Island of Kos, Greece, May 21, 2006, pp. 4-120, Piscataway, NUJ, USA.

\* cited by examiner

US 8,890,730 B2

CALIBRATION OF A SWITCHING INSTANT OF A SWITCH

FIELD OF THE INVENTION

An embodiment relates to integrated circuit devices ("ICs"). More particularly, an embodiment relates to calibration of a switching instant of a switch for a signal converter of an IC.

BACKGROUND

In conventional digital-to-analog converters ("DACs"), such DACs may be unary, binary, or segmented. A conventional segmented DAC may be thought of as two DACs in one DAC, where most significant bits ("MSBs") for example are thermometer weighted or coded bits and least significant bits ("LSBs") are binary weighted. Output of any of these types of DACs may have some error due to timing differences among switches, such as transistors for example, of such DACs.

Accordingly, it would be useful to provide compensation to resolve or reduce timing errors of a DAC to enhance performance.

SUMMARY

An apparatus relates generally to calibration of a signal converter. Such apparatus includes a first digital-to-analog converter ("DAC") and a calibration system coupled to an output port of the first DAC. The calibration system includes a second DAC. The calibration system is configured to provide an adjustment signal responsive to a spurious spectral performance parameter in an output of the first DAC. The spurious spectral performance parameter is sensitive to a timing error associated with the first DAC. The calibration system is coupled to provide the adjustment signal to the first DAC to correct the timing error of the first DAC.

A method relates generally to calibration of a signal converter. Such method includes providing an output signal from a first digital-to-analog converter ("DAC"). An adjustment signal responsive to a spurious spectral performance parameter in the output signal of the first DAC is provided. The spurious spectral performance parameter is sensitive to a timing error associated with the first DAC. The adjustment signal is provided to the first DAC to correct the timing error of the first DAC. The first DAC is calibrated using the adjustment signal.

BRIEF DESCRIPTION OF THE DRAWINGS

Accompanying drawings show exemplary embodiments. However, the accompanying drawings should not be taken to limit the embodiments shown, but are for explanation and understanding only.

FIGS. 14-1 through 14-4 are respective signal diagrams depicting various exemplary signals or tones.

FIGS. 17-1 through 17-4 are respective signal diagrams respectively depicting an exemplary differential analog output, an exemplary differential amplifier output, an exemplary mixer output, and an exemplary low pass filter output for the correction system of FIG. 5.

DETAILED DESCRIPTION

Figure 1:
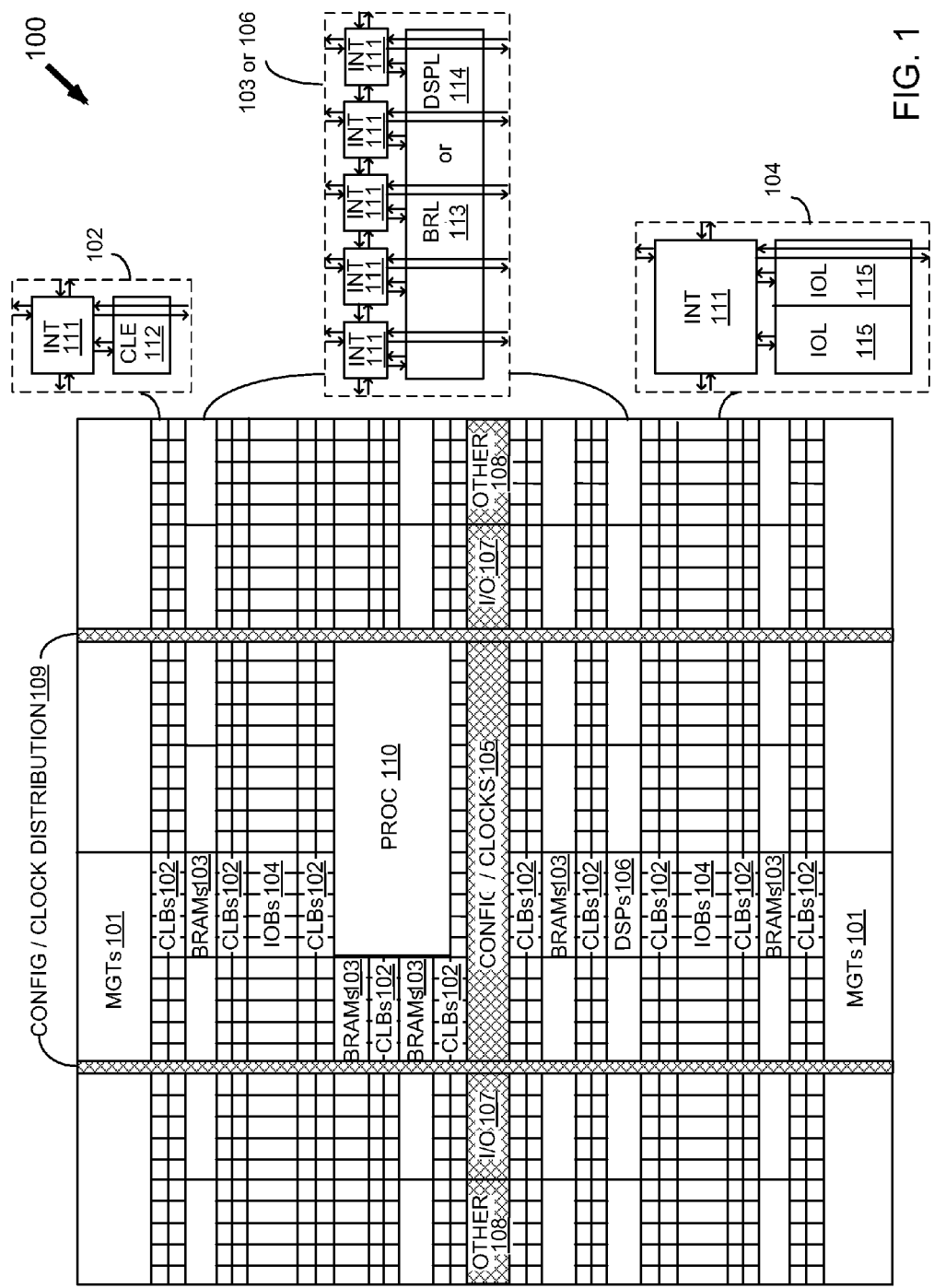
FIG. 1 is a simplified block diagram depicting an exemplary embodiment of a columnar Field Programmable Gate Array ("FPGA") architecture.

In the following description, numerous specific details are set forth to provide a more thorough description of the specific embodiments. It should be apparent, however, to one skilled in the art, that one or more embodiments may be practiced without all the specific details given below. In other instances, well known features have not been described in detail so as not to obscure the one or more embodiments. For ease of illustration, the same number labels are used in different diagrams to refer to the same items; however, in alternative embodiments the items may be different.

Before describing exemplary embodiments illustratively depicted in the several figures, a general introduction is provided to further understanding. Current-steering digital-to-analog converters ("DACs") may have a segmented (i.e., two DACs in one DAC, namely a thermometer coded DAC and a binary weighted DAC), binary weighted, or unary (i.e., thermometer coded only) architecture. While the following description is generally in terms of DACs that include a binary series of transistors, DACs employing a segmented or unary architecture may likewise benefit from better performance using the technology described herein. Along the lines of a binary series of transistors, such transistors are conventionally doubled in size from one transistor to a next transistor in such binary series. However, there may be variations in one or more switching instants of such transistors. These of variations may degrade linearity of such DACs. Again, even though the following description is generally in terms of a binary series, namely a binary coded DAC, it should be apparent from the following description that technology described herein may be used for thermometer coded DACs and/or segmented DACs.

As described below in additional detail, measurement and correction of timing errors in current-steering DACs may be used for calibration of such DACs. Along those lines, an output port of a DAC under calibration may be coupled to a calibration system. Such calibration system may include one or more other DACs to provide corresponding adjustment signals to such DAC under calibration. Such a calibration system may be configured to detect a spurious spectral performance parameter in an output of such a DAC under calibration. Such spurious spectral performance parameter may be sensitive to a timing error associated with an output of such DAC under calibration. Responsive to such detected spurious spectral performance parameter, such calibration system may generate an adjustment signal to adjust or correct for a timing error in such output of such DAC under calibration. In other words, using detection of a spectral component in a frequency domain associated with a timing error in a time domain, an adjustment signal for correction of such timing error may be generated. With the above general understanding borne in mind, various embodiments for DAC calibration are generally described below.

Because one or more of the above-described embodiments are exemplified using a particular type of IC, a detailed description of such an IC is provided below. However, it should be understood that any IC having a DAC may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA. FPGA 100 may have a current-steering DAC either provided in dedicated hardware or instantiated in programmable resources, or a combination thereof. Furthermore, packaged chips as described herein are not limited to monolithic devices, such as monolithic FPGAs for example, but may include multiple die stacked upon one another or upon an interposer, or a combination thereof, and packaged as a chip, such as for example Stacked Silicon Interconnect Technology ("SSIT"). Thus, for example, one or more DACs may be on one die in such packaged chip and one or more portions of FPGA reconfigurable resources may be on another die in such packaged chip, and such die may be coupled to one another using an interposer.

Figure 2:
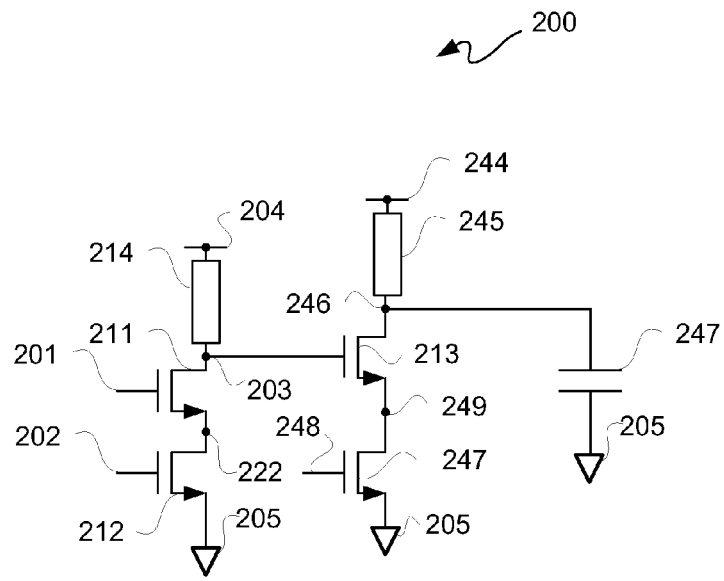
FIG. 2 is a block/circuit diagram depicting an exemplary conventional driver current-steering switch circuit of a current-steering digital-to-analog converter ("CS-DAC").
Figure 3:
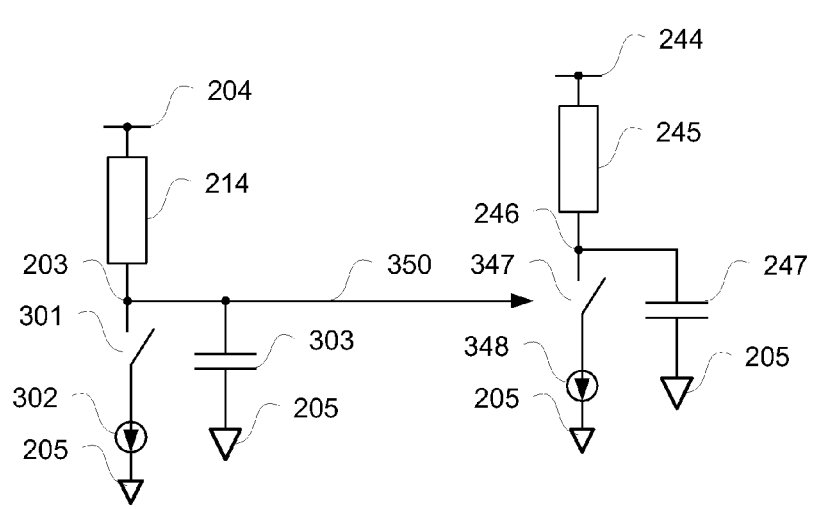
FIG. 3 is a block/circuit diagram depicting an exemplary driver switch model of the driver current-steering switch circuit of FIG. 2.

FIG. 2 is a block/circuit diagram depicting an exemplary conventional driver current-steering switch circuit 200 of a current-steering DAC. FIG. 3 is a block/circuit diagram depicting an exemplary driver switch model 300 of driver current-steering switch circuit 200 of FIG. 2. With simultaneous reference to FIGS. 2 and 3, driver current-steering switch circuit 200 is further described.

A supply voltage 204, such as $V_{DD}$ for example, is coupled to a driver resistive load 214, $R_{drv}$. Resistive load 214 is further coupled to a driver node 203. In this example, transistors 211 through 213 are NMOS transistors; however, NMOS and/or PMOS transistors, or other types of transistors, may be used in other embodiments. A drain node of transistor 211 is coupled to driver node 203, and a source node of transistor 211 is coupled to common node 222. Transistor 211 is a driver transistor. A drain node of transistor 212 is coupled to common node 222 to provide a drain-to-source coupling between transistors 211 and 212. A source node of transistor 212 is coupled to ground 205. Transistor 212 is a current source for driver transistor 211.

A gate of transistor 211 is coupled to receive a drive signal 201, as transistor 211 is effectively a driver switch, and a gate of transistor 212 is coupled to receive a tail signal or other bias voltage signal 202, as transistor 212 is effectively to provide a tail current source. A gate of transistor 213 is coupled to driver node 203. A source node of transistor 213 may be coupled to a current sink, such as provided by transistor 247 with current being sourced by termination voltage 244 through a resistive load 245, and a drain node of transistor 213 may be coupled to an output node 246 of a DAC. A parasitic capacitance 247 is illustratively depicted as coupled between output node 246 and ground 205. A source node of transistor 213 may be coupled to a common node 249. Effectively, transistor 213 may provide a current-steering ("CS") switch. A drain node of transistor 247 may be coupled to common node 249 for a drain-to-source coupling of transistor 247 to transistor 213. A source node of transistor 247 may be coupled to ground 205. A gate of transistor 247 may be coupled to receive a bias voltage 248. Along those lines, transistor 247 may provide a current steering current sink.

To model switch dynamics, a capacitance, as modeled by capacitor 303, may be used to approximate a gate capacitance value $C_g$ of a current steering switch as associated with transistor 213, which may be modeled as a constant value. Transistors 211 and 212 may be respectively replaces with a driver switch 301 and a driver current source 302. Likewise, transistors 213 and 247 may be respectively replaced with a current steering switch 347 and a current steering current source 348.

When transistor 211 is in a substantially nonconductive channel state ("off"), a corresponding driver switch 301 is open, and CS switch 347 is closed responsive to driver signal 350 on node 203. When current steering switch 347 is closed, transistor 213 is in a substantially conductive channel state ("on").

Before driver switch 301 closes, a gate voltage level on current steering switch 347 is generally determined by a Vdd 204 supplied current passing through resistive load 214, namely driver signal 350, which charges up gate capacitance 303. Moreover, when driver switch 301 is closed, namely draws current through driver current source 302, and thus CS switch 347 is open responsive to driver signal 350 at node 203.

Figure 4:
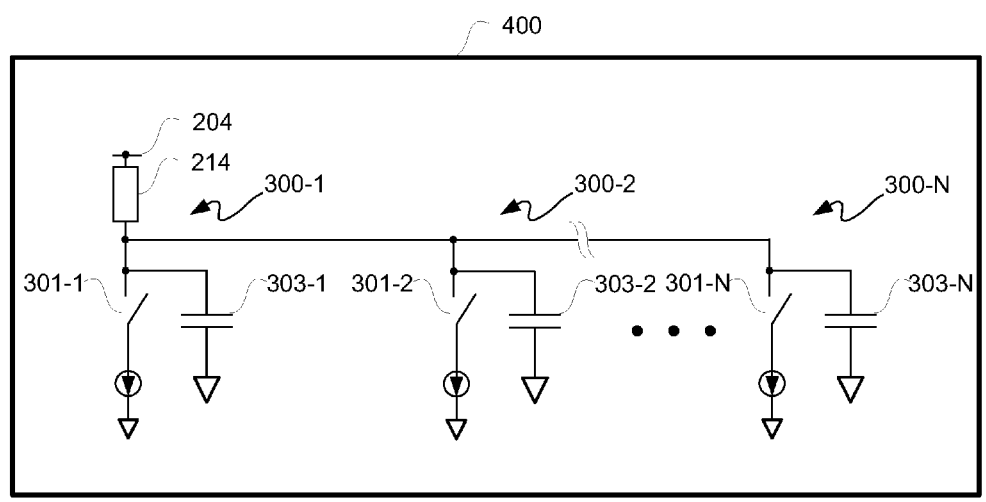
FIG. 4 is a block/circuit diagram depicting an exemplary conventional CS-DAC

FIG. 4 is a block/circuit diagram depicting an exemplary conventional CS-DAC 400. CS-DAC 400 may have a plurality of driver current-steering switch circuits 200, which may be modeled as driver switch models or current-steering cells 300-1 through 300-N, for N a positive integer greater than 1. A current-steering cell may simply be a current source in series with a switching element. For example, CS-DAC 400 may be a binary weighted DAC, where transistors and current sources of progressively larger sizes are used; or CS-DAC 400 may be a unary weighted DAC of current steering cells; or CS-DAC 400 may be a segmented DAC with a combination of thermometer coded and binary coded current steering cells; or CS-DAC 400 may be a segmented DAC with a combination of first thermometer coded current steering cells of a coarse granularity for MSBs and a second thermometer coded current steering cells of a fine granularity for LSBs. Accordingly, CS-DAC 400 may have any of a variety of types or combinations of types of current steering cells, and so even though generally binary current steering cells are described for purposes of clarity, it should be understood that any type of current steering cell and thus any type of CS-DAC may be used.

Depending on an applied digital code input to CS-DAC 400, some or all of these current-steering cells 300-1 through 300-N may participate in the conversion process. Due to systematic voltage losses (e.g., IR drops in layout) and/or random errors (e.g., process spread), participating current-steering cells 300-1 through 300-N in a conversion may not all switch at the same instant. This may leads to non-ideal code transitions, resulting in spurs in an output spectrum. Additionally, two cells in spatially separate parts of CS-DAC 400 may switch at the same instant, but, due to delays in an output network of CS-DAC 400, their contributions may not sum at the same instant. So, more generally, the following description when discussing timing errors encompasses such output dependent delay errors as well.

Current-steering cells or "fingers" 300-1 through 300-N may share a common resistive load 214. For example, if current through switch 301-1 is $I_0$ then current through switch 301-2 may be twice that of current through switch 301-1, namely $2I_0$. A next switch immediately following switch 301-2 may have a current through it of $4I_0$. Accordingly, one or more transistors associated with switch 301-2 may generally be twice as big as one or more transistors associated with switch 301-1. Moreover, one or more transistors associated with a switch immediately following switch 301-2 may generally be four times as big as one or more transistors associated with switch 301-1. Correspondingly, capacitances associated with such transistors used to provide such switches may be progressively larger. For example, capacitance of capacitor 303-2 is significantly larger than capacitance of capacitor 303-1. Likewise, capacitance of a capacitor of a next finger following driver switch model 300-2 is significantly larger than capacitance of capacitor 303-2.

Assuming N is equal to 3, then for a code 110, fingers 300-1 and 300-2 may be switched on and finger 300-3 may be switched off. If a next code is 001, such that fingers 300-1 and 300-2 may be switched off and finger 300-3 may be switched on, there may be a timing glitch due to having more time to switch on such large transistors associated with finger 300-3 than smaller transistors associated with fingers 300-1 and 300-2 for example.

Others have suggested breaking up larger current steering cells, whether binary coded or thermometer coded, or a combination thereof, into smaller current steering cells. Thus, for example a transistor in one current steering cell may be represented as multiple smaller transistors respectively associated with multiple current steering cells. Whether thermometer coded and/or binary coded current steering cells are used, this breaking up of current steering cells to enhance accuracy or precision likewise increases size. With respect to binary coded current steering cells in particular, one or more binary-to-thermometer decoders may be used, so as to equalize switching transition times to avoid timing glitches, namely to more uniformly distribute the timing dynamics. However, having one or more binary-to-thermometer decoders in a DAC means such a DAC may be quite large.

Accordingly, by being able to adjust timing of any or all of current steering cells or fingers 300-1 through 300-N, performance may be enhanced whether for binary coded and/or thermometer coded conversion cells with respect to adjusting timing between and/or among current steering cells of a CS-DAC. Furthermore, with respect to a CS-DAC having binary coded current steering cells, a more area efficient DAC may be provided by being able to adjust timing of any or all of fingers 300-1 through 300-N, without having to have any binary-to-thermometer decoder present in such an area efficient DAC.

With simultaneous reference to FIGS. 2 through 4, for CS switch to close, generally a gate voltage of transistor 213 exceeds a source voltage thereof by a threshold voltage value. For purposes of clarity by way of example not limitation, this condition may generally be thought of as a "switching instant" of driver CS switch circuit 200. When a driver switch closes at time t, gate voltage, $V_G$, on transistor 213 may charge as follows:

$$V_G = V_{DD} - V_{G0} \exp\left(-\frac{t}{\tau}\right), \quad (1)$$

where $\tau = R_{drv}C_g$. Time taken $\Delta t_{on}$ for gate voltage to transition from $V_G$ to $V_G + V_{th}$ is given by rearrangement of Equation (1) where $V_G$ has been replaced by $V_G + V_{th}$ and t has been replaced by $\Delta t_{on}$ yielding:

$$\Delta t_{on} = \tau \ln \frac{V_{G0}}{V_{DD} - V_{G0} - V_{TH}}. \quad (2)$$

Using Equation (2), it may be understood that a low-performance or low-resolution DAC may be used to calibrate a high-performance or high-resolution DAC. Timing sensitivity to an initial value of gate voltage $V_{G0}$ which can be controlled via tail current in a driver current-steering switch circuit may be encompassed by Equation (2). Similarly, timing sensitivity to switch threshold voltage and associated back gate voltage is also encompassed by Equation (2).

As described below, a low-performance DAC is referred to herein as a timing calibration DAC ("TCALDAC") to distinguish it from a DAC under calibration. Output of such a TCALDAC may be referenced to a bulk potential of a switching transistor. For purposes of clarity by way of example and not limitation, a DAC under calibration shall be referred to hereinbelow as a CS-DAC. Resolution of a TCALDAC may depend on a timing resolution to be used, which may vary from application-to-application.

Figure 5:
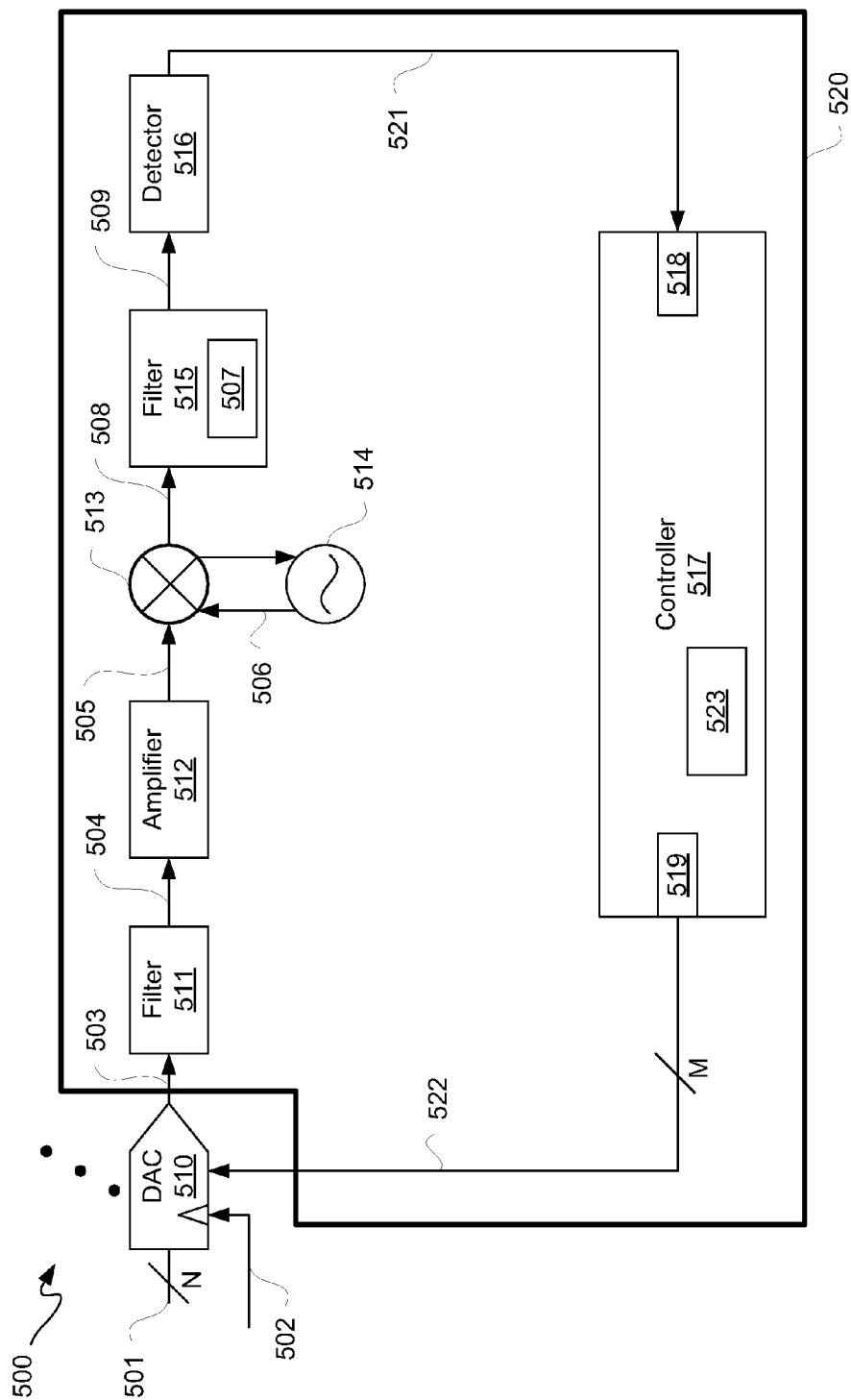
FIG. 5 is a block diagram depicting an exemplary correction system.

FIG. 5 is a block diagram depicting an exemplary correction system 500. Correction system 500 includes calibration system 520, as well as a DAC 510, such as a CS-DAC for example, coupled to calibration system 520 to be calibrated. Other types of DACs that may be used include without limitation resistor ladder and switched capacitor DACsAs described below in additional detail, one or more timing errors in analog output 503 of CS-DAC 510 may be characterized by measuring spurious components in the frequency domain of analog output 503. These errors may then be corrected by adjusting the timing of switching events inside CS-DAC 510.

More specifically, CS-DAC 510 may be stimulated by a series of digital codes that correspond to sinusoidal excitation with an associated frequency, $F_{out}$. For purposes of clarity and not limitation, it shall be assumed that digital input 501 to CS-DAC 510 is a sinusoidal digital tone having a fundamental frequency, $F_{out}$. Digital input 501 may be N bits wide, where for N associated with a high-resolution DAC. A clock signal 502 may be provided to CS-DAC 510, and such clock signal may be at a frequency, $F_s$.

For a CS-DAC 510, a Fourier transform of the output spectrum of an analog output 503 may show a spectral component at frequency $F_{out}$, and may further show one or more spurious components ("spurs") at harmonics or non-harmonics of such fundamental frequency, $F_{out}$. The precise location of these spurs may depend on the architecture. For example, in a single ended CS-DAC 510, a dominant spur may be at $2*F_{out}$, and for a differential CS-DAC 510, a second order non-linearity may generally cancel out a dominant spur at $2*F_{out}$, yielding a spur at a third harmonic $3*F_{out}$. Thus generally, analog output 503 may have a fundamental frequency, $F_{out}$, plus spurious components, $n*F_{out}$, where n represents an nth harmonic. Even though harmonic spurs conventionally dominate, some DACs may have performance more limited by non-harmonic components. Along those lines the following description is applicable to any dominant spur, whether harmonic or non-harmonic, provided origin of such spur is related to switching dynamics of a CS-DAC. Furthermore, a non-dominant spur may be a spur of interest.

Spurs may come from one or more of three error mechanisms in a DAC. One error mechanism may be due to amplitude errors or mismatch between current sources in a DAC. These amplitude errors can be largely calibrated out for example as described in U.S. Pat. No. 7,466,252 B1. Another error mechanism may be due to timing errors relating to conversion or switching instant and/or output delay, as described above. A difference in switching instants between current-steering cells tends to be on the order of picosecond timescales for contemporary high performance signal converters.

For completeness, yet another error mechanism may be due to variations in output impedance of a DAC. A non-ideal current source can be modeled as an ideal current source in parallel with an impedance. Any variation in the voltage across the non-ideal current source may cause such parallel impedance to shunt a voltage dependent current, thereby degrading accuracy of such conversion process. For sufficiently high output frequencies, parasitic capacitances associated with a DAC structure may act as this non-ideal impedance and the amount of current shunted may vary as a DAC transitions over all codes. A code dependent error may be non-linear, and therefore spurs may arise in the output spectrum.

Continuing with FIG. 5, CS-DAC 510 analog output 503 spectrum may be provided as input to a first filter 511. Filter 511 may filter analog output 503 spectrum such that generally only a spurious component of interest is provided as part of a filter output 504. Filter 511 may be bandpass filter generally centered about a spur of interest. Optionally, filter 511 may be a notch filter generally centered on fundamental frequency $F_{out}$. Filter output 504 may be provided as an input to a gain stage, such as amplifier 512 for example. Along those lines, filter output 504 may effectively generally only provide a spurious component of interest for admission to such gain stage.

Amplifier 512 may be optional though spur amplitude may be substantially suppressed. For example, spur amplitude may be suppressed by 50 or more decibels lower relative to a fundamental frequency $F_{out}$. Thus, without amplification, leakage and/or self-mixing of a local oscillator 514 might dominate output spectrum of mixer output 508 of mixer 513. Accordingly, for purposes of clarity by way of example and not limitation, it shall be assumed that amplifier 512 is employed.

Amplified output 505 from amplifier 512 is provided as an input to mixer 513. Thus, amplified output may be mixed with a local oscillator 514 coupled to mixer 513, where frequency of local oscillator 514 may be set to correspond to frequency of a spurious component of interest. Frequency components in mixer output 508 of mixer 513 may be a sum ("sum frequency") of or a difference ("difference frequency") between a spur frequency of amplified output 505 and an oscillator frequency of oscillator output 506 of local oscillator 514 provided as input to mixer 513. As local oscillator and spur frequencies may nominally be the same, this may yield a sum tone at twice a spurious frequency and a difference frequency close to zero Hertz (or DC).

A second filter 515 may optionally be coupled to receive mixer output 508. Filter 515 may have an associated gain stage 507 to provide filter output 509 to detector 516. Along those lines, filter 515 may be used to remove a sum frequency in one instance and to pass a difference frequency in another instance, as applicable, to detector 509. For example, filter 515 could be implemented as a low pass filter or active integrator. Detector 516 may be configured to detect or measure an amplitude of each difference frequency passed to it. For example, detector 516 could be implemented as an analog-to-digital converter ("ADC").

Detector output 521 from detector 516 may be provided to an input port 518 of a control block ("controller") 517. Controller 517 may be configured in hardware and/or software to record each state of detector output 521 input thereto. Responsive to such states of detector output 521, controller 517 may be configured to generate a set of M control signals 522 output from output port 519 of controller 517, where M is a positive integer greater than zero. Generally, there may be one control signal 522 for each switch of CS-DAC 510 involved in current steering, such as switches of current-steering cells as previously described. Control signals 522, which may be analog in nature, may be provided to CS-DAC 510 for correcting one or more timing errors, as described below in additional detail. Along those lines, each resulting change to control signals 522 may be used to improve performance of CS-DAC 510, where effectively controller 517 observes such changes in performance in order to adjust control signals 522 until an optimal or near optimal result is found. In an embodiment, controller 517 may include a state machine 523 for such iterative adjustment. However, in another embodiment, an algorithm may be implemented in software to perform such iterative adjustment. These are but two examples of many ways to obtain an optimal or near optimal result using controlled feedback.

Control signals 522 may be used to adjust switching dynamics through control of a driver signal applied to a switch transistor gate node and/or through control of a bulk potential of a well associated another switch transistor, as described below in additional detail.

Figure 6:
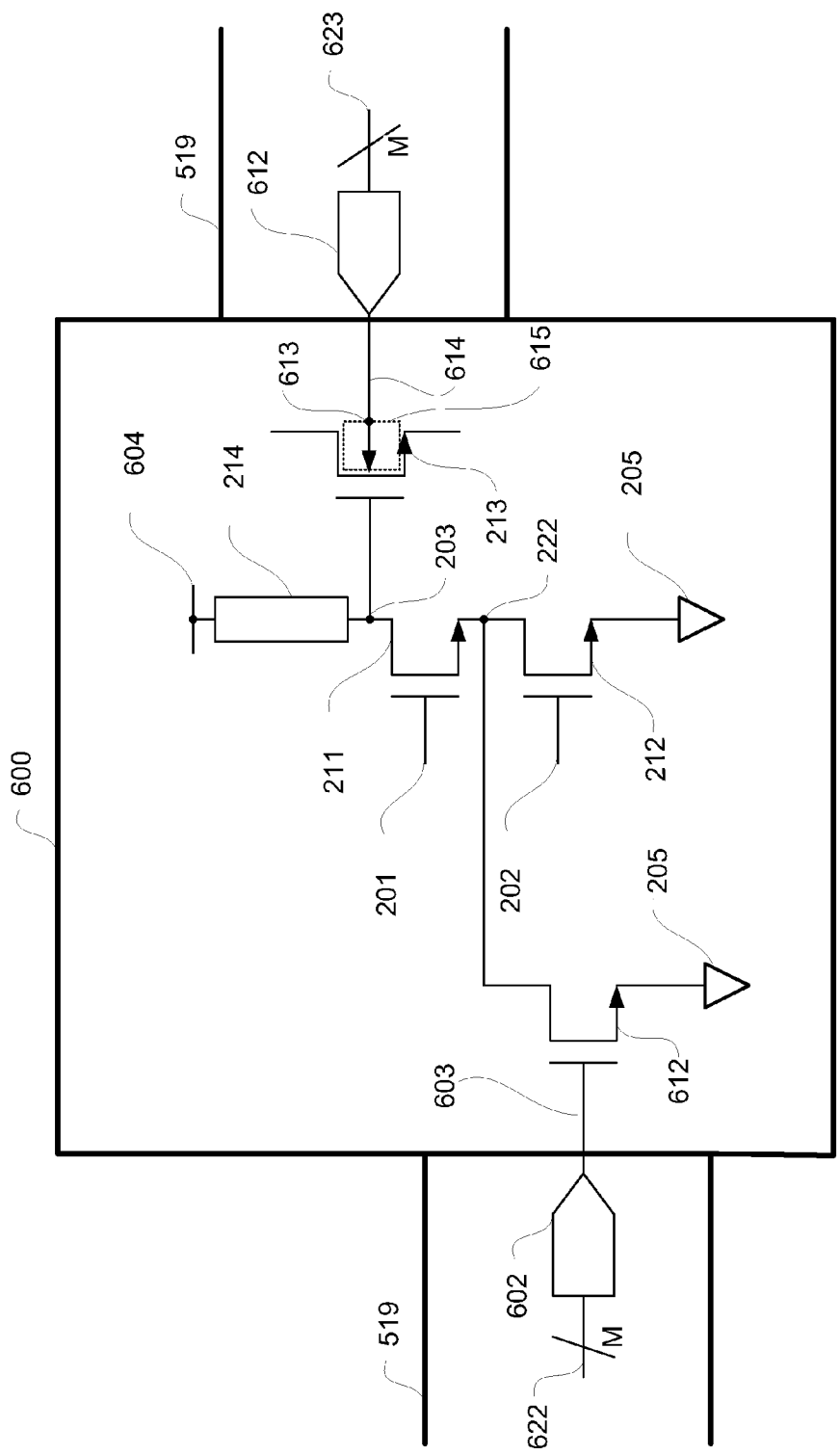
FIG. 6 is a block/circuit diagram depicting an exemplary driver current-steering switch circuit of a CS-DAC of FIG. 5.

FIG. 6 is a block/circuit diagram depicting an exemplary driver current-steering switch circuit 600 of a CS-DAC 510 of FIG. 5. Driver current-steering switch circuit 600 has some common components with driver current-string switch circuit 200 of FIG. 2, and accordingly generally only differences are described below for purposes of clarity. Driver current-steering switch circuit 600 is further described with simultaneous reference to FIGS. 5 and 6.

Control signals 622 may be used to provide a code, c1, as an input to a TCALDAC 602, which TCALDAC may be part of an output port 519 of controller 517. In this example, there are M control bits per TCALDAC 602, and there are N TCALDACs 602 for the N input bits to CS-DAC 510, so there may be a total of N*M bits for a binary system or more than N*M control bits for a segmented system. Analog output 603 of TCALDAC 602 may be provided to a gate node of NMOS transistor 612 of driver current-steering switch circuit 600. Even though an NMOS transistor 612 is illustratively depicted, PMOS and/or NMOS transistors, or other types of transistors, may be used. A source node of transistor 612 is coupled to ground 205, and a drain node of transistor 612 is coupled to common node 222. Optionally, transistor 212 may be removed to allow transistor 612 to do the entirety of this operation.

Control signals 622, which may include analog output 603, may be used for biasing a plurality of NMOS transistors 612 of an associate plurality of driver current-steering switch circuits 600 of CS-DAC 510, where each such analog output 603 may be used to adjust a swing of driver current-steering switch circuit 600 via its tail current. Along those lines, NMOS transistors 612 in a driver current-steering switch circuit 600 may be referred to as a tail current adjustment configuration.

Responsive to such code, c1, applied to TCALDAC 602, an additional amount of tail current may be sunk in parallel to a main tail current transistor 212. This may be used to adjust current flowing through resistive load 214 when a driver switch, such as transistor 211, is closed or on. In this state, current-resistance ("IR") drop across resistive load 214 may be used to provide an off voltage to a current-steering switch, such as transistor 213. When such a driver switch, such as transistor 211, opens or turns off, a gate voltage on transistor 213 may begin to transition toward an analog supply voltage, VDDA, 604. Such supply voltage, VDDA 604, which replaces a digital logic supply voltage VDD 204, which may be a cleaner supply voltage to avoid coupling of digital noise on VDD 204. Generally, responsive to gate voltage of transistor 213 being a threshold voltage above a source voltage thereof, transistor or switch 213 may be considered on, namely in a substantially conductive state. Therefore, a control code, c1, may be used to effectively set a starting voltage for transition of transistor 213 from a substantially nonconductive or off state to an on state to thereby effect a time for a switching instant of such device. Generally, a nominal current through transistor 212 may be specified such that with TCAL-DAC 602 operating at its mid-code or generally thereabouts, swing of driver current-steering switch circuit 600 may be generally at a nominal value therefor. Along those lines, a positive or a negative relative timing adjustment may be applied responsive to such code c1. Accordingly, a current-steering cell or finger may have its timing adjusted, or more particularly its switching instant adjusted to affect an adjustment to output timing. Because the above-described control feedback path uses an output of CS-DAC 510, delay associated with an output network of such CS-DAC 510 is taken into account in such adjustment.

The above-described tail current adjustment configuration may be used with a bulk voltage adjustment configuration, as described below in additional detail. Moreover, an adjustable resistance block and/or adjustable capacitance block, as described below in additional detail, may have volatile or nonvolatile programmable elements for storing states of control signals 522 in a tail current adjustment configuration or a bulk voltage adjustment configuration. Furthermore, such a bulk voltage adjustment configuration may be used separately or independently of such tail current adjustment configuration.

For a bulk voltage adjustment configuration, control signals 623 may be used to provide a code, c2, to TCALDAC 612 of an output port 519 of controller 517. Analog output 614, which may be part of timing adjustment control signals 522 of FIG. 5, from TCALDAC 612 may be coupled to a body bias node 613 of transistor 213. This assumes registering M bits locally at a time for successive application to a selected or addressed current steering cell of current steering cells 600 for a binary weighted DAC of N bit resolution. Optionally, N*M bits may be used to individually address each of such N current steering cells 600 of such a binary weighted DAC of N bits at one time (i.e., direct addressing without registering). If, however, a segmented CS-DAC or a unary CS-DAC were used, the number of control bits would be much larger for a same resolution N. For example, an N bit unary CS-DAC may have 2^(N−1) bits for current steering cells, and so there may be M*2^(N−1) control bits, which may be provided in a successive form to reduce bus width. Thus, an N bit resolution DAC has different implications depending on configuration of such DAC.

Body bias node 613 may be coupled to provide a bulk potential to a well 615 of transistor 213. In other words, a bulk voltage or body bias of transistor 213 may be adjusted to adjust a bulk-to-source potential difference of transistor 213. This adjustment may be a one-time adjustment, in contrast to having to dynamically adjust bulk potential during operation. Again, as there may be a plurality of driver current-steering switch circuits 600 in a CS-DAC 510, there may be plurality of transistors 213 and an associated plurality of body bias nodes 613. Optionally, there may be one common P-well 615 shared by multiple transistors 213 in a CS-DAC 510, and thus such common P-well 615 may have a single body bias node 613 for supporting such associated multiple transistors 213. For purposes of clarity by way of example and not limitation, it shall be assumed that each NMOS transistor 213 has a separate P-well 615 for individual control thereof responsive to an associated analog output 614.

Such bulk-to-source potential difference adjustment may be used to alter an operative threshold voltage of transistor 213. Along those lines, by lowering a source-to-bulk potential difference by increasing a bulk potential, a threshold voltage of transistor 213 may be reduced. With a lowered threshold voltage for transistor 213, as driver transistor 211 transitions toward VDDA, transistor 213 may switch or turn on earlier than without such bulk potential adjustment to effectively speed up when a switching instant of a current-steering cell occurs. Conversely, a switching instant may be slowed down by decreasing a bulk potential of transistor 213 relative to source voltage of transistor 213 to increase an operative threshold voltage of transistor 213, transistor 213 may switch or turn on later than without such bulk potential adjustment to effectively slowdown when a switching instant of a current-steering cell occurs. Thus, a code, c2, applied to TCALDAC 612 may be used to affect an adjustment in a switching instant of a current-steering cell.

Generally, timing adjustment control signals 522 may be registered locally in each CS-DACs 510 of a same IC. Additionally, such CS-DAC 510 using calibration need not be dedicated to calibration, as a multiplexer (not shown for purposes of clarity) may be coupled between output of CS-DAC 510 and filter 511. Furthermore, for a bulk a voltage adjustment configuration and a tail current adjustment configuration, timing adjustment control signals 522 may be analog signals.

To recapitulate, timing errors may cause a variation in one or more switching instants of a DAC, which may degrade DAC linearity. A heterodyne detection, as described above, is used to detect or measure an output parameter of such DAC, namely spurious spectral performance, sensitive to timing errors. Such error may be calibrated by adjusting switching instant via adjusting bulk source potential of participating current-steering switches and/or adjusting swing of drivers respectively upstream of such switches. By iterative adjustment, each resulting change in DAC performance may be detected and an optimum therefor may be found as part of a controlled feedback system.

Figure 7:
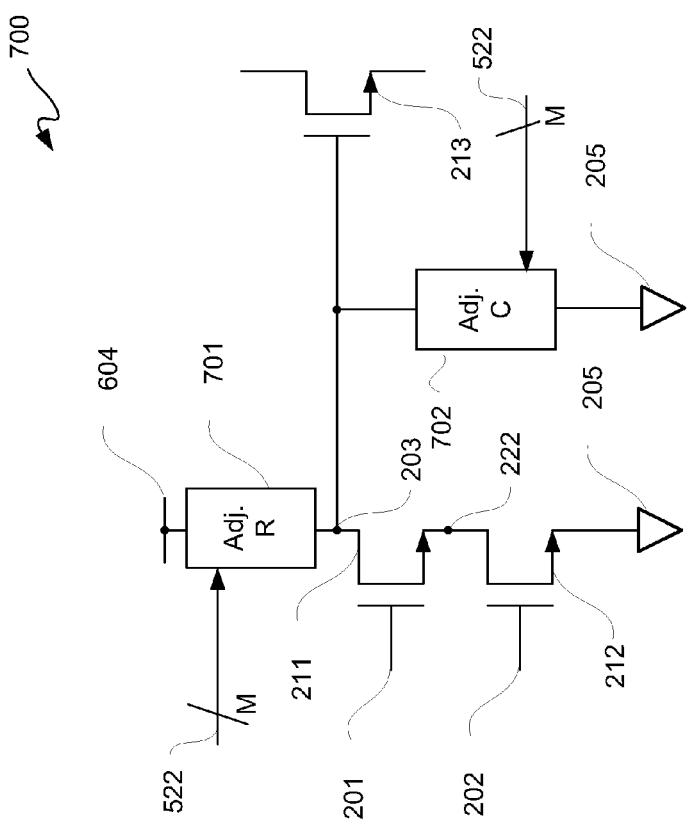
FIG. 7 is a block/circuit diagram depicting another exemplary driver current-steering switch circuit of a CS-DAC of FIG. 5.

FIG. 7 is a block/circuit diagram depicting an exemplary driver current-steering switch circuit 700 of a CS-DAC 510 of FIG. 5. Driver current-steering switch circuit 700 has some common components with driver current-steering switch circuit 200 of FIG. 2, and accordingly generally only differences are described below for purposes of clarity. Driver current-steering switch circuit 700 is further described with simultaneous reference to FIGS. 5 and 7.

All or a portion of control signals 522 may be used to provide a code, c3, as an input to a programmably adjustable resistance or load block 701, and/or all or another portion of control signals 522 may be used to provide a code, c4, as an input to a programmably adjustable capacitance block 702. In this configuration, control signals 522 may be digital signals for switching on or off fingers of adjustable resistance block 701 and/or adjustable capacitance block 702. Optionally, a DAC may be used to drive a bias voltage signal to a PMOS transistor configured to operate in a linear or resistive region. Moreover, adjustable resistance block 701 and/or adjustable capacitance block 702 may have volatile or nonvolatile programmable elements for storing states of control signals 522. Along those lines, after programming driver current-steering switch circuit 700 of a CS-DAC 510, calibration system 520 may be decoupled from CS DAC 510. Along those lines, an IC may include multiples of CS-DACs 510. Each of these CS-DACs 510 generally may be programmed to incorporate any timing adjustment associated with calibration of at least one of such CS-DACs 510.

Adjustable resistance block 701 may be coupled between a VDDA 604 and driver node 203. Adjustable capacitance block 702 may be coupled between driver node 203 and ground 205 to switch in additional capacitance on switch gates. Resistance of adjustable resistance block 701 may be adjusted responsive to a code, c3, provided via control signals 522 to such adjustable resistance block, and/or capacitance of adjustable capacitance block 702 may be adjusted responsive to a code, c4, provided via control signals 522 to such adjustable capacitance block. Driver resistance and/or output capacitance may be used to adjust switching instant of driver current-steering switch circuit 700.

With reference to FIGS. 6 and 7, one or more of the four mechanisms described to adjust switching instant of a driver current-steering switch circuit may be used either singly or in any combination. However, for purposes of clarity by way of example and not limitation, the following description is premised on use of driver current-steering switch circuit 600.

Returning to FIG. 5, controller 517 may be configured to execute an algorithm, whether embodied in hardware and/or software, such as for example to optimize spectral performance of a CS-DAC 510 by varying switching instant of switches thereof through use of M timing adjustment control signals 522. Such M timing adjustment control signals 522 may be provided via outputs of one or more TCALDACs, such as one or more TCALDACs 602 and/or one or more TCALDACs 612, of output port 519.

Controller 517 may vary control signals 522 while monitoring detector output 521. States of detector output 521 may be stored in correlation to apply control signals 522 in storage of or accessible to controller 517, such as BRAM for example.

An increase in recorded amplitude of detector output 521 may infer performance degradation, whilst a lower amplitude may be commensurate with improved performance. There are many algorithms that may be used by controller 517 to improve or optimize performance. Such algorithms include without limitation a blind search of all possible codes, steepest descent, or a genetic algorithm. Generally, any algorithm directed at minimization of a value, which in this instance may be minimization of detector output amplitude, may be used. A blind search of all the codes may be feasible for certain DAC architectures and may yield a global minimum for a calibration space. However, more sophisticated algorithms may be employed with care to avoid confusion of a local minimum as being a global minimum when a "blind" search of all codes is not performed.

Furthermore, CS-DAC 510 is illustratively depicted as having a single output, and thus for clarity a single-ended embodiment is illustratively depicted.

However, CS-DAC 510 may have two outputs, namely a differential output. Accordingly, the description herein likewise applies to differential embodiments.

Concepts detailed herein may be applied to discrete, SoC, or hybrid implementations of such a system. However, controller 517 naturally lends itself to implementation in a reconfigurable environment, such as an FPGA or microprocessor for example, where freedom provided by correction system 500 allows direct assessment of efficiency of a variety of algorithmic implementations.

Even though heterodyning to determine error in a current-steering cell by impact on spurious performance of a converter excited by a sinusoidal excitation, such as a digital sinusoid input to a DAC as a whole, is described, embodiments other than heterodyning may be used along the lines described herein to tailor temporal dynamics of any or all switches in a converter to minimize or reduce timing errors associated therewith. However, it should be appreciated that a single heterodyne stage may be used to determine such timing error. Furthermore, timing errors may be corrected or minimized at a cellular level, such as for example for each current-steering cell, to actually fix errors, in contrast to for example attempting to minimize an error by mapping switching sequences to an input digital code. Along those lines, it is possible that there may be one or more input codes for which there may be no mapping to cancel out participating switching errors, and thus, as the above-described timing error adjustment may be used to actually fix errors, limitations associated with use of mapping switching sequences to an input digital code may be avoided. Generally, along those lines, the above-described timing error adjustment may be agnostic to an input code in comparison with mapping.

With the above description borne in mind, various other embodiments are further described. Along those lines, even though NMOS transistors are used in the following description, again it should be understood that PMOS or a combination of NMOS and PMOS transistors may be used in other embodiments.

Figure 8:
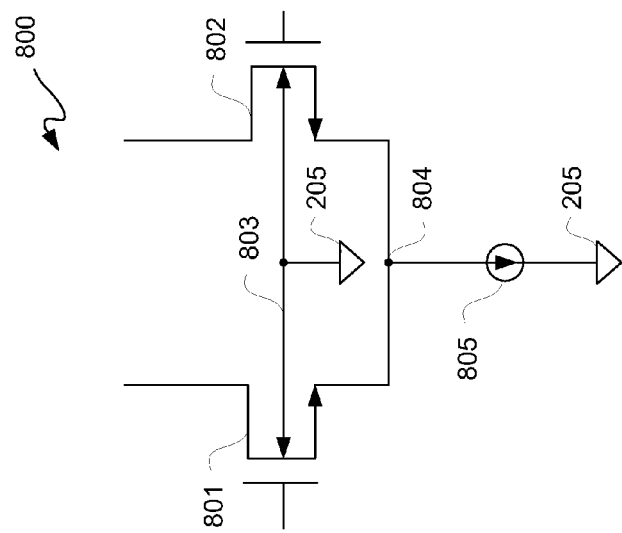
FIG. 8 is a circuit diagram depicting an exemplary differential current-steering cell.

FIG. 8 is a circuit diagram depicting an exemplary differential steering cell 800. Differential current-steering cell 800 may be one of a plurality of current-steering cells 800 in a CS-DAC 510 of FIG. 5. NMOS transistor 801 and NMOS transistor 802 have their source nodes commonly coupled at common node 804. A current source 805 coupled between common node 804 and ground 205 may represent a tail current. Though current source 805 may be a single transistor, more likely current source 805 is implemented as cascoded transistors. Output cascoded transistors (not shown) may be located above switches or transistors 801 and 802, as is known. Differential current-steering cells are common in high performance converters; however, the description herein is applicable to both differential and single-ended current-steering cells.

CS-DAC 510 may have a digital code input to it, and responsive to a value of such digital code, control signals may be applied to the gates of switches 801 and 802 in current-steering cells 800 of such CS-DAC 510. For a current-steering cell 800, one of switches 801 and 802 may be on or closed during routing current through that branch, and another one or a complementary one of switches 801 and 802 may be off or open. Again, a CS-DAC 510 may be made up of several of current-steering cells 800 depending on architecture thereof, and such current-steering cells 800 may be binary weighted, thermometer coded, or segmented coded. For differential architectures, outputs may be taken in a single ended or differential manner. Because the following description addresses dynamics of switches, such description is applicable to all of these architectures.

A P-type body, bulk or well connection of NMOS transistors 801 and 802 may be coupled to a ground 205 through a common node 803. Along those lines, such body region may be provided by a P-substrate or a P-well, including without limitation a P-well of a triple well structure. For an NMOS device, a "back-gate" or "back body effect" on NMOS transistors 801 and 802 may be reduced or minimized by coupling a P-well thereof in a triple well structure to a source node of such transistors. For a PMOS configuration, an N-well may likewise be coupled to a source node of a PMOS transistor or to a logic high or highest potential for an associated voltage domain. Along those lines, a source bulk potential VSB can be used to control drain source current and switching dynamics of a transistor.

Generally, a "back gate" effect is considered a nuisance. For example, as NMOS transistors are stacked one upon another, their source potential is raised relative to their bulk regions, where such bulk regions may be at a ground potential as detailed above. Increased source bulk potential for an NMOS transistor makes it more difficult to invert the channel in such transistor and more difficult to turn on such switch.

These dynamics are described by the well-known Shichmann Hodges equation and VSB threshold voltage dependence equation, respectively a transistor current Equation (1) and a threshold voltage Equation (2):

$$I_{DS} = \frac{KP_N}{2}\frac{W}{L}(V_{GS} - V_{TH})^2(1 + \gamma V_{DS}), \text{ and} \quad (1)$$

$$V_{TH} = V_{TH0} + \gamma(\sqrt{2|\phi_F| + V_{SB}} - \sqrt{2|\phi_F|}). \quad (2)$$

Generally, these Equations are only valid for long channel processes; however, phenomena described above are generally observable at all process nodes. Though the above-description was for NMOS devices, a similar analysis applies to PMOS devices.

If a bulk node is isolated from a substrate, as would be in the instance of an NMOS device in a triple well or using an n-well for a PMOS device, back gate bias may be independently controlled. For a fixed driver configuration at switch gates, switching dynamics may thus be independently controlled using a back gate as previously described with reference to FIGS. 5 and 6. Along those lines, switching dynamics may be controlled through a driver by varying its swing.

Differences in the switching transition dynamics between current-steering cells can lead to glitches and other non-uniformities in an output in contrast to having all associated switches close at the same instant in time. For example, a switch S1 may close first and at some later duration in time, an associated switch S2 may close. For the duration in time, a non-ideality or glitch in an output may be present. A variation in switching dynamics and associated switching instant may be attributed to random semiconductor process variations and/or possibly systematic errors, such as I-R gradients across a switching array. As described below in additional detail, switching dynamics may be altered such that variation in switching events may be reduced or minimized.

As described above, it was assumed that dynamics between two or more current-steering cells have amplitudes which are identical between such cells. Thus, in the aforementioned discussion, it was implicitly assumed that there were no amplitude error contributions to a data converter output due to, for example, mismatch between current sources. This assumption has been made in view of ability to calibrate out such amplitude errors, for example as described in U.S. Pat. No. 7,466,252 B1.

Figure 9:
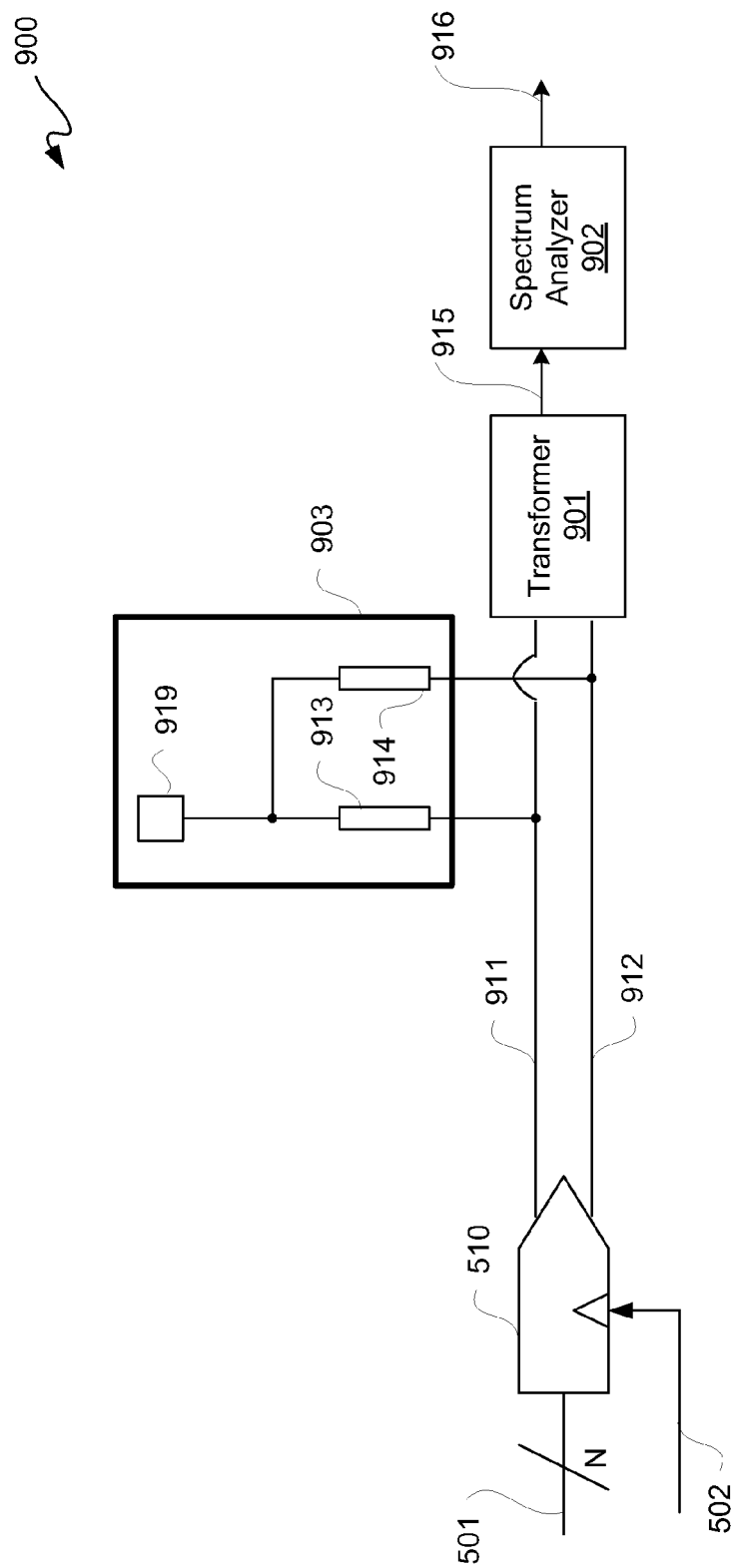
FIG. 9 is a circuit/block diagram depicting an exemplary test bench.

Data converters may be characterized using in part spectral tests for high-speed high performance devices. The above-description was generally directed at DACs having a single-ended output; however, a DAC may have a differential output. FIG. 9 is a circuit/block diagram depicting an exemplary test bench 900. For a CS-DAC 510, a digital sinusoidal stimulus input signal 501 and a clock signal 502 may be applied as previously described, and a resulting differential output may be analyzed using a spectrum analyzer 902. In this example, CS-DAC 510 is configured to provide a differential output, namely output signals 911 and 912. Output lines respectively associated with output signals 911 and 912 may be coupled to a termination network 903. Termination network 903, which converts current to voltage and provides an impedance match to transformer 901, may include termination resistive loads 913 and 914 coupled to respective output lines associated with output signals 911 and 912. Of course, in another configuration fewer or more than two resistors may be used. A transformer 901 may be coupled to receive output signals 911 and 912 to transform such differential analog signals into a single ended output 915, and output 915 of transformer 901 may be provided as an input to spectrum analyzer 902 to provide spectrum analyzer output 916. Additionally, termination network 903 may be coupled to either a termination supply or a ground, as generally indicated with box 919.

Figure 10:
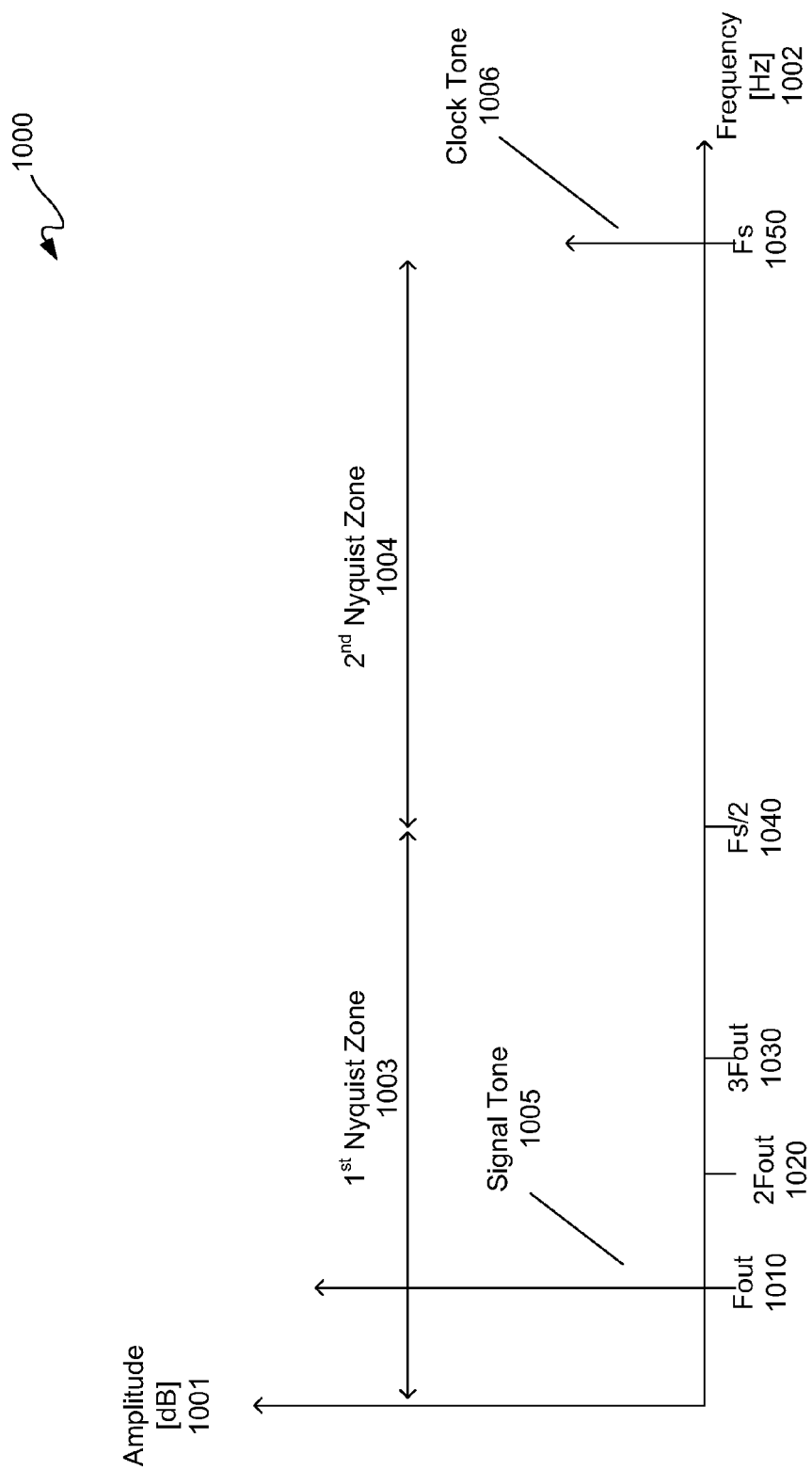
FIG. 10 is a signal diagram depicting an exemplary ideal converter spectral output.
Figure 11:
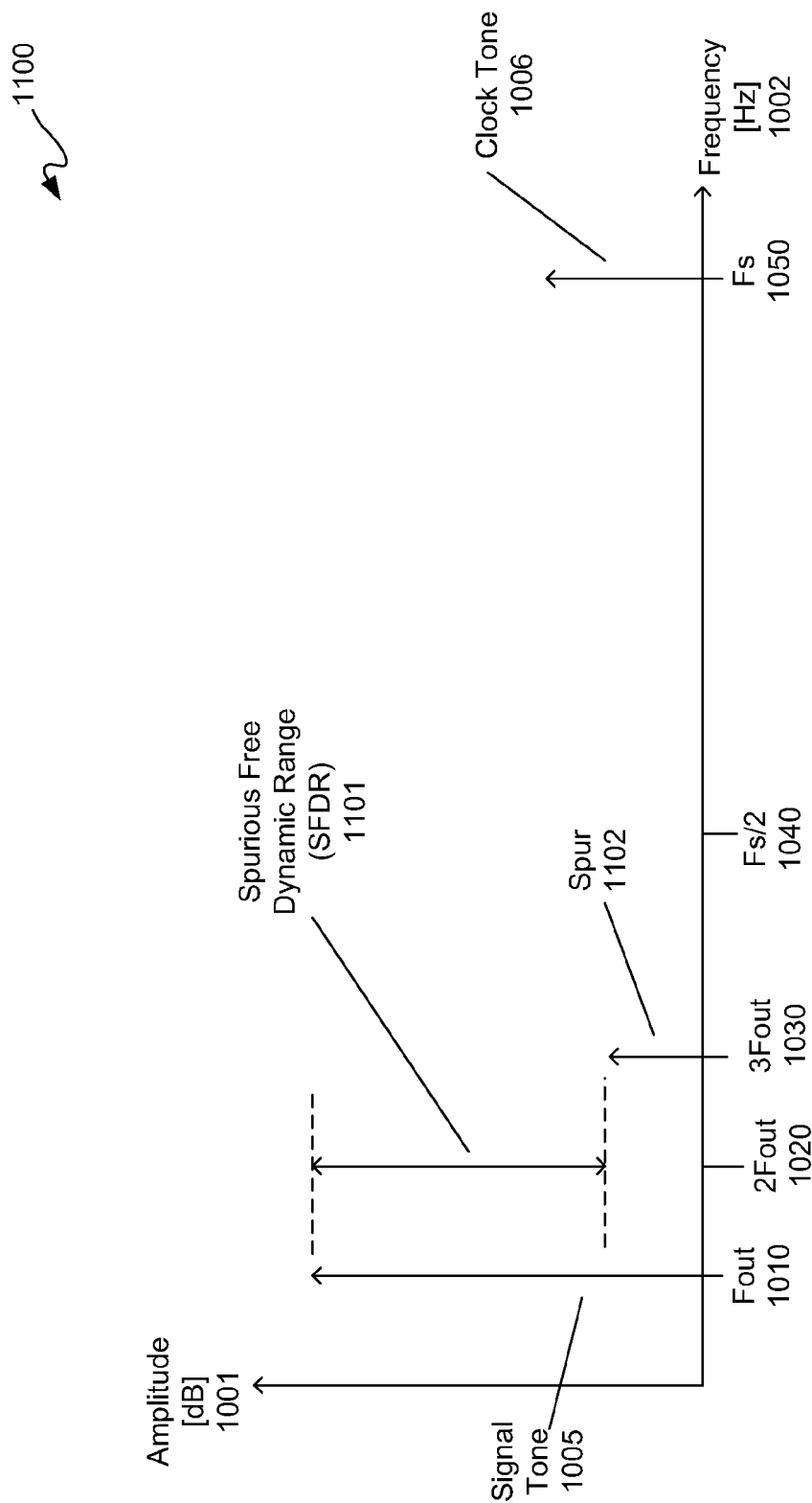
FIG. 11 is a signal diagram depicting an exemplary non-ideal converter spectral output.

FIG. 10 is a signal diagram depicting an exemplary ideal converter spectral output 1000, and FIG. 11 is a signal diagram depicting an exemplary non-ideal converter spectral output 1100. With simultaneous reference to FIGS. 10 and 11, test bench 900 is further described. In each of FIGS. 10 and 11, an X-axis is a frequency axis 1002 in Hertz, and a Y-axis is in amplitude axis 1001 in decibels.

For an ideal DAC 510 excited by an ideal sinusoidal input 501, conventionally a signal tone 1005 would be observable in output 916 of spectrum analyzer 902. Such signal tone 1005 may be in a first Nyquist zone 1003 at a frequency $F_{out}$ 1010. Non-idealities in a DAC 510 may lead to spurs in an output spectrum, such as illustratively depicted in FIG. 11. The ratio of signal amplitude to largest spur amplitude may be defined as the spurious free dynamic range ("SFDR") 1101, namely the ratio of amplitude of signal tone 1005 at frequency $F_{out}$ 1010 to amplitude of spur 1102 at frequency $3F_{out}$ 1030.

For current-steering cells operating in single-ended manner, a dominant spur may be at a second harmonic of an output tone, termed HD2. For differential output current-steering cells, a second order non-linearity tends to cancel out, and a dominant spur may be at three times a fundamental frequency, termed HD3. Depending on the ratio of output fundamental tone to sample rate of a signal converter, images of these spurs lying in a second Nyquist zone 1004 can fold back in band. Along those lines, for a suitably well-designed DAC, there may be fingerprint frequencies in an output spectrum that are characteristic of converter performance. These fingerprint frequencies can be determined a priori with knowledge of the converter architecture, clock sample rate and frequency of output tone. Along those lines, other frequencies which may be of interest are $2F_{out}$ 1020, $F_S/2$ 1040 and $F_S$ 1050, where a clock tone 1006 is at frequency $F_S$ 1050.

Timing errors of a classification described herein may have an indicative frequency response that causes spectral metrics, such as for example SFDR 1101 to roll-off at 20 dB/decade as the output frequency Fout is increased. Such timing errors may manifest themselves for output tones with associated frequencies of tens to hundreds of MHz. Below this range, amplitude errors may dominate, and above this range, output impedance may start to limit performance. Once again, amplitude errors in a converter output can be corrected as described in U.S. Pat. No. 7,466,252 B1.

Figure 12:
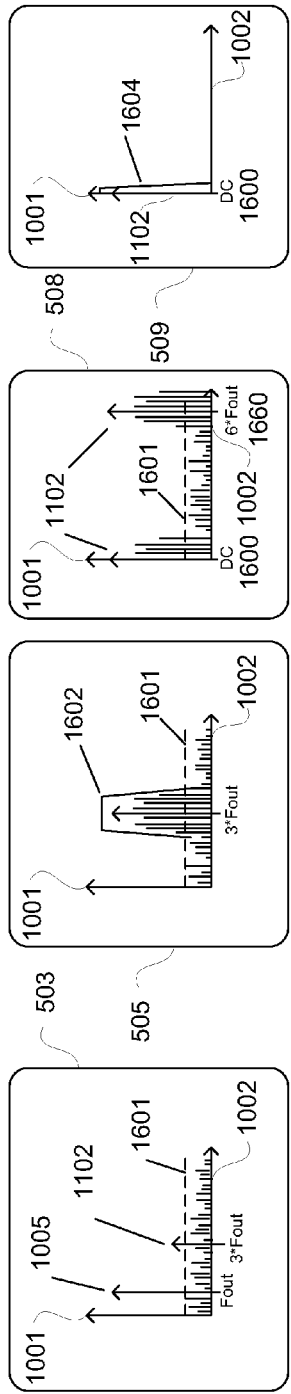
FIG. 12 is a block diagram depicting another exemplary correction system.

FIG. 12 is a block diagram depicting another exemplary correction system 500. Correction system 500 includes calibration system 520, as well as a DAC 510, such as a CS-DAC 510 for example, coupled to calibration system 520 to be calibrated, as previously described though with the following differences. Again as previously described and described below in additional detail, one or more timing errors in analog output 503 of CS-DAC 510 may be characterized by measuring spurious components in the frequency domain of analog output 503. These errors may then be corrected by adjusting the timing of switching events inside CS-DAC 510.

CS-DAC 510 provides a differential analog output 503 to a band pass filter 511. An upper output net of CS-DAC 510 may be coupled to a termination resistive load 913, and a lower output net of CS-DAC 510 may be coupled to a termination resistive load 914. Filter output 504 may be a differential output which is provided to amplifier 512. Amplifier 512 may provide a differential amplifier output 505 to mixer 513. Optionally, band pass filter 511 and amplifier 512 may be combined into a single circuit 1210. Mixer output 508 may be provided as an input to low pass filter 515, and filter output 509 of low pass filter 515 may be provided as an input to detector 516. TCALDACs 602 and/or 612 of output port 519 of controller 517 may be used to provide M calibration or timing adjustment signals 522 to CS-DAC 510.

For a plurality of TCALDACs 602 and/or 612 in controller 517, where each may provide M control signals 522, there may be for example X*M outputs or X sets of M control signals 522 each for an array of X CS-DACs 510. Other details regarding correction system 500, as previously described, are not repeated for purposes of clarity.

To more fully understand characterization of spurious performance of CS-DAC 510, exemplary signal timing diagrams of FIGS. 17-1 through 17-4 are provided. FIGS. 17-1 through 17-4 are further described with simultaneous reference to FIGS. 10 through 12. FIGS. 17-1 through 17-4 respectively correspond to differential analog output 503, differential amplifier output 505, mixer output 508, and low pass filter output 509.

Correction system 500 uses a heterodyning process to down convert spurious tone of interest to DC for measurement. In this embodiment, a differential CS-DAC 510 for which a fingerprint spur 1102 may be associated with the third harmonic of the fundamental frequency, namely $3*F_{out}$ 1030. For a single-ended CS-DAC 510, such fingerprint spur 1102 would be at the second harmonic of the fundamental frequency, $2*F_{out}$ 1020; however, the following description though in terms of a differential output similarly applies to a single-ended output. Other spurious tones may exist in an output spectrum of a signal converter, but those detailed above tend to have the most energy and may thus provide a greater dynamic range in measurements, as described below in additional detailed.

CS-DAC 510 may be operated at a frequency of interest, namely fundamental frequency $F_{out}$ 1010, to have a main or signal tone 1005 at such frequency. Along those lines, a spectral region exists where timing errors may be manifest, with some being above and others being below a noise floor 1601, and thus a signal tone 1005 may be synthesized for such fundamental frequency $F_{out}$ 1010.

Due to non-idealities in CS-DAC 510, a spur at $3*F_{out}$ 1030 may be produced along with signal tone 1005. A bandpass filter ("BPF") 511 coupled to receive differential analog output 503 may be used to suppress such fundamental and spurious tones other than a tone of interest, namely generally a spur 1102 at $3*F_{out}$ 1030. Passband parameters to provide a BPF envelope 1602 of BPF 511 may be relatively relaxed owing to frequency selectivity of a mixer-low pass filter ("LPF") combination. Attenuation parameters of BPF 511 may provide better suppression of a fundamental and spurs of correction system 500 than noise floor 1601 limit. Optionally, a notch filter centered on the fundamental frequency of correction system 500 may be used to provide the same effect as BPF 511.

A gain stage, namely amplifier 512, may be used after BPF 511 as spur 1102 amplitude may be attenuated with respect to amplitude of main tone 1005. Invariably amplifier 512 may amplify some of the noise products within passband of BPF 511, as generally indicated in FIG. 17-2. Optionally, in another embodiment, an active filter 1210 may be used to encompass both amplifier 512 and BPF 511.

Such amplified spur 1102 may then be applied to mixer 513. Local oscillator 514 frequency may be specifically set to the spur frequency, namely $3*F_{out}$ 1030 in this example, as this frequency may be known a priori. Mixer 513 may produce tones at sum and/or difference frequencies of spur 1102 and local oscillator 514 for heterodyning.

Therefore, frequencies of mixer output 508 may be close to 0 Hz, namely DC 1600, and $6*F_{out}$ 1660. In other words, differences may result in spur 1102 being down converted to DC 1600, and sums may result in spur 1102 being up converted to $6*F_{out}$ 1660. Optionally, a high-order LPF 515 may be used to remove each sum component. A high-order LPF 515 may be used to generate a low-cutoff frequency of such filtering operation. Such a low cut-off frequency may serve to attenuate noise components that were amplified within a passband of BPF 511, and subsequently down converted. Along those lines, it may be easier to make a high-pole LPF 515 than a high-Q BPF 511 with an equivalent passband; however, either embodiment may be used.

A resulting signal-to-noise ratio at filter output 509 of LPF 515 can be quite high owing to the ratio of a strong spur amplitude to a small unfiltered noise bandwidth. Along those lines, for output of LPF 515 to stabilize, a waiting duration of time may be employed, where such duration of time is equivalent to approximately at least six LPF filter time constants. This duration may be used to effectively set a rate at which a calibration procedure can be updated.

Filter output 509 of LPF 515, or an active integrator used in place of LPF 515 as described below in additional detail, may essentially be a positive frequency portion 1604 of a BPF envelope 1602 that is related to an original spur 1102 amplitude with system gain taken into consideration. Along those lines, a low speed analog-to-digital converter ("ADC") with signal-to-noise performance better than filter output 509 of LPF 515 can be used to supply a digital representation of a sampled amplitude provided to controller 517. In other words, correction system 500 and filter output 509 are provided to detector 516 to provide detector output 521, and detector output 521 may be a digital signal of width D. Optionally, an algorithmic state machine 523 of controller 517 may effectively provide an analog control loop. In an embodiment, a system level optimization may be performed by trading passband parameters of BPF 511 for integration time in LPF 515 for a targeted signal-to-noise ratio.

BPF 511 may be upstream of mixer 513 so as to remove the main tone 1005 at fundamental frequency 1010, as such fundamental frequency 1010 is harmonically related to a spur of interest, such as spur 1102. Optionally, a non-harmonically related spur of interest may be admitted with a BPF which rejects a fundamental frequency. If such fundamental frequency were not removed, then amplitude of such main tone 1005 relative to such spur, for example spur 1102, might saturate amplifier 512. Even if amplifier 512 is not saturated by such ratio, such as spur 1102 for example, may be amplified to a level comparable to main tone 1005, and thus mixer output 508 might contain a DC contribution from such fundamental frequency in addition to a desired component related to such spur.

Detector output 521 may correlate with amplitude of spur 1102. A timing error characterized by amplitude of spur 1102 may be improved by adjustment of a back gate bias and/or driver swing, as previously described. Along those lines, TCALDACs 612 and/or 602 may be provided as part of controller 517. Such TCALDACs may have resolution parameters, as well as anticipated operational ranges, in order to affect a desired change in timing instant, as previously described.

To recapitulate, timing discrepancy between current-steering cells may be on the order of picoseconds. Back gate biasing may have a timing sensitivity, which may vary depending upon embodiment; however, for purposes of clarity it may be assumed to be approximately 25 ps/V. Along those lines, a modest resolution DAC, namely with 5 or more bits, and a full-scale output voltage of approximately 0.5 V may be able to affect timing changes better than approximately 0.5 ps per code increment when applied to a TCAL-DAC 612. Correction accuracy may be increased for a higher resolution converter and/or a more restricted full-scale range. Swing adjustment via TCALDAC 602 may achieve a sensitivity of approximately 50 ps/V. For a modest resolution converter, comparable timing changes to back gate biasing may be obtained. A TCALDAC 602 with a voltage output driving a current sink in parallel with a main tail current device may be used. Optionally, a TCALDAC 602 in a current sink configuration may be used. The above values are just exemplary, and these and/or other values may be used as may vary from application-to-application.

As previously described, algorithms which may be instantiated in controller 517 may be used, where such algorithms may more readily lend themselves to an implementation in an FPGA. As described below in additional detail, algorithm feasibility is described in terms of execution time.

It should be borne in mind that a brute force approach may be the most pessimistic or conservative approach for estimate purposes, and thus test time might be shortened for a less conservative approach. Furthermore, for a T bit TCALDAC, a brute force iteration through the 2^T possible codes may be highly non-optimal, as only a small set of such codes may be of significance. Therefore, another search approach would be a bisection or binary search. Additionally, it should be borne in mind that a brute force test approach does not take advantage of architectural considerations to reduce the amount of current-steering cells that might significantly benefit from timing calibration. For example, in a 12b binary weighted architecture, only the 6 most significant bits may dominate spectral performance and therefore might significantly benefit from timing calibration. Correcting timing for these bits alone may have a dramatic performance improvement and reduce test time by approximately 3 or more orders of magnitude to hundreds of milliseconds. Use of more intelligent algorithms such as steepest descent or genetic algorithms may reduce test time even further. For other architectures such as segmented or unary CS-DACs with much greater numbers of switches, such switches may be calibrated in groups as unary cells in close proximity to one another, while only suffering small random timing differences. Those spatially far apart switches may suffer from systematic effects, and therefore grouping spatially proximate switches may yield calibration efficiencies. Depending on implementation, equivalent $F_{out}$ tones may be generated for differing switching sequences. Differential analysis of results for the same $F_{out}$ but different switching sequences may help identify which switches are dominant in an error process of correction system 500. Along those lines, a CS-DAC 510 may be configured to have redundant switches, so as to be able to cut out one or more switches dominating error conditions. Overall, generally, knowledge of and implemented architecture may be used to dramatically reduce test time without much effect on overall performance. Calculated test times may be reasonable for performance package tests or known-good die ("KGD") approaches.

To recapitulate, performance of a DAC is enhanced by calibrating timing errors associated with one or more switching events. Though the above-description was in terms of an FPGA, an ASIC, or a discrete DAC with other components implemented as discrete parts on a printed circuit board ("PCB") with a controller 517 provided by a digital signal processor, FPGA or microcontroller, or a data converter and signal conditioning circuitry up to and including filter 515 may be implemented on analog fabric as a separate die as part of a stacked die with or without interposer die configuration. The detector could be the XADC implemented on the FPGA digital fabric in which the control algorithm operates. The TCALDACs could be implemented on the analog fabric. Analog processing blocks, as described herein, may depend on the circuit environment. For example, a mixer may be implemented as a Gilbert cell mixer for an IC analog fabric die implementation or as a passive diode ring mixer on a PCB.

Furthermore, correction system 500 may be implemented as an on-chip built-in self-test ("BIST") circuit, where such resources may be dedicated or returned to a pool of available resources after calibration. Along those lines, registers or other storage devices coupled to one or more DACs 510 may be used to store results of calibration for controlling switching instances of one or more DACs 510. Along those lines, programmable resources of FPGA 100 or other programmable resources may be used to control TCALDACs for controlling DACs 510.

Local oscillator 514 may be implemented as a DAC, as described-below for example. For purposes of clarity by way of example and not limitation, it is assumed that two arrays of CS-DACs 510 are provided on a DAC die. Further, for purposes of clarity by way of example and not limitation, it is assumed that within each array there are multiple I-Q DAC pairs that all share a same sample global sampling clock. One DAC 510 in an I-Q pair may be used to synthesize a $3*F_{out}$ local oscillator signal while the other DAC 510 in such pair undergoes a timing correction. Harmonics of a DAC 510 used for local oscillator 514 may thus be effectively at $9*F_{out}$ of the DAC undergoing timing calibration, and would likely not fall within the bandwidth of mixer 513. An advantage of this approach is that I-Q DACs 510 in a pair, within such an array, may be inherently phase locked to each other as they use the same sampling clock.

Using DACs 510 as local oscillators 514 may save silicon area and may facilitate calibrating multiple DACs 510 in parallel. Using DACs 510 as local oscillators 514 may also facilitate using arbitrary tone frequencies to be generated to allow testing at any desired frequency within a converter's operational range. For example, a DAC 510 under test may have its output spectrum scanned for the largest spurious tone, and an inference, for example with respect to specification compliance failure, may be drawn should this tone not be found at a fingerprint location. Optionally, the technology described herein may be applied to the largest spur to minimize its amplitude. For any configuration, frequency selectivity of DAC oscillators 514 may be combined with a detection scheme to sweep output spectrum of a DAC 510 under test to characterize such output pre- and post-calibration. This may be used to ensure calibration corrected errors throughout a DAC 510 output spectrum, as opposed to just correcting at the frequency associated with a spurious tone. For an embodiment with a swept output spectrum, BPF 511 may be tunable, or, optionally, a super heterodyne using two or more cascaded mixer stages, such as including respective mixers 513, may be used to provide super heterodyne modes for producing intermediate and baseband down converted frequency components. Such a swept output spectrum embodiment is not described in any more detail for purpose of clarity, as it follows directly from standard communications theory and the preceding description herein.

Figure 13:
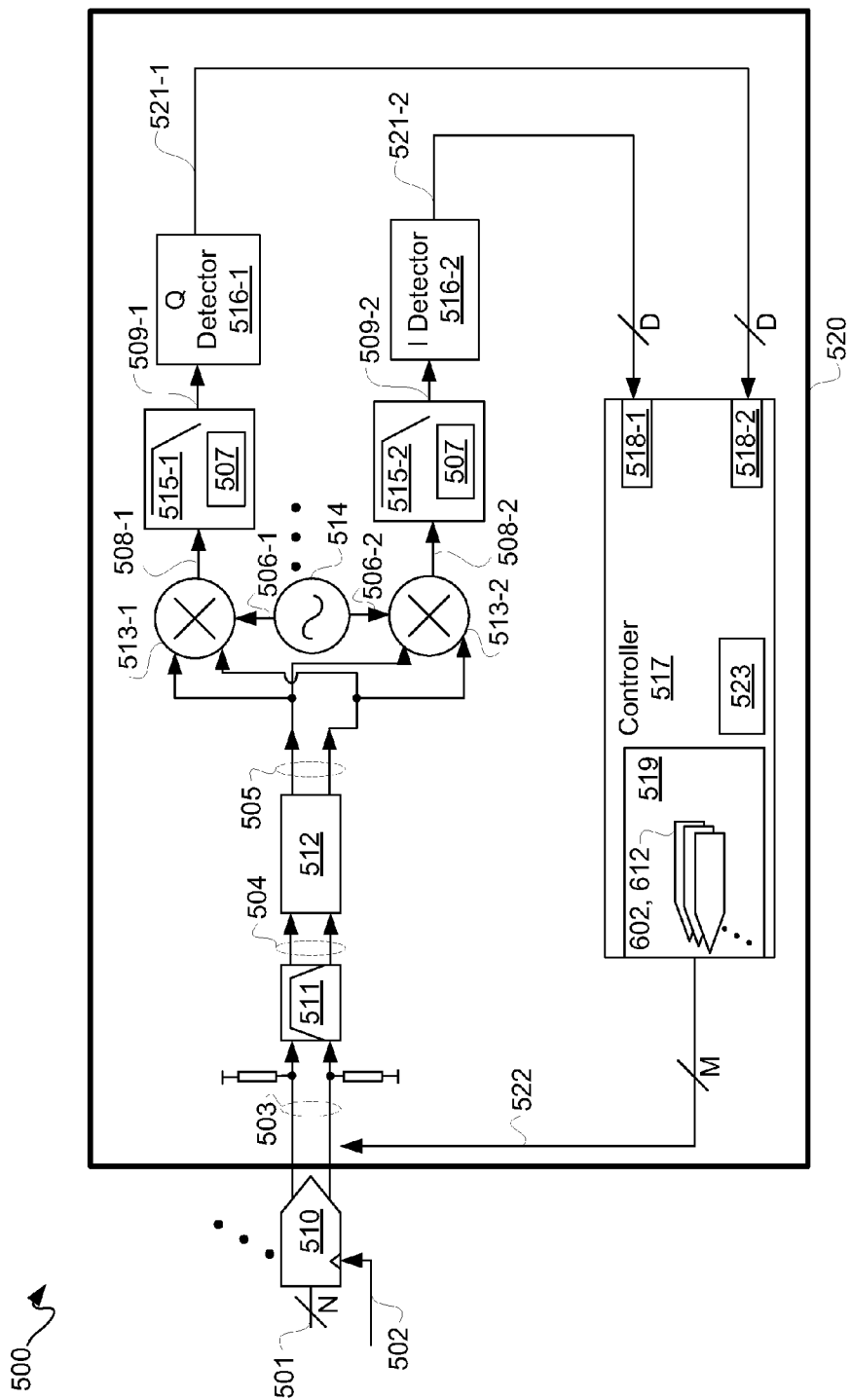
FIG. 13 is a block diagram depicting yet another exemplary correction system.

FIG. 13 is a block diagram depicting yet another exemplary correction system 500. Correction system 500 includes calibration system 520, as well as a DAC 510, such as a CS-DAC 510 for example, coupled to calibration system 520 to be calibrated, as previously described though with the following differences. Again as previously described and described below in additional detail, one or more timing errors in analog output 503 of CS-DAC 510 may be characterized by measuring spurious components in the frequency domain of analog output 503. These errors may then be corrected by adjusting the timing of switching events inside CS-DAC 510.

In correction system 500 of FIG. 13, amplifier output 505 is provided to an upper mixer 513-1 and a lower mixer 513-2. Oscillator output 506-1 of local oscillator 514 is provided to mixer 513-1, and oscillator output 506-2 of local oscillator 514 is provided as an input to mixer 513-2. Oscillator outputs 506 may be 90 degree phase shifted with respect to one another. For purposes of clarity by way of example and not limitation, it shall be assumed that oscillator output 506-1 is phase shifted 90 degrees, and that oscillator output 506-2 is not phase shifted, namely respective 90 and 0 degree signals. Along those lines, local oscillator 514 may be two local oscillators. For example, input to one oscillator DAC 514 may be delayed relative to the other oscillator DAC 514 by a number of clock or oscillator cycles corresponding to a desired phase shift.

Effectively heterodyning as previously described herein may be extended to produce a lock-in configuration of correction system 500 of FIG. 13. By using two oscillators 514, or a single oscillator 514 with two outputs that are 90 degree phase shifted with respect to one another, amplitude and phase of a spur may be measured or detected with respect to an associated local oscillator 514 output.

Thus, mixer output 508-1 of mixer 513-1 is provided as an input to filter 515-1 to obtain filter output 509-1 for input to Q detector 516-1. Mixer output 508-2 of mixer 513-2 is provided as an input to filter 515-2 to obtain filter output 509-2 for input to I detector 516-2.

Amplitude information yielded by correction system 500 of FIG. 13 may be comparable to correction system 500 of FIG. 5. However, phase information yielded by correction system 500 of FIG. 13 may provide additional insights. Along those lines, Q-detector output 521-1 of Q-detector 516-1 and I-detector output 521-2 of I-detector 516-2 may be provided to respective input ports 518-1 and 518-2 respectively as a Q detector input and an I detector input. For purposes of clarity and not limitation, it shall be assumed that each of such inputs is D bits wide, for D a positive integer. Controller 517 may be configured to process two TCALDAC trim codes responsive to such I and Q inputs for providing the same amplitude information, as previously described, but different phase information. A change of phase as a function of a TCALDAC trim code may be exploited to indicate a direction of a search amongst TCALDAC trim codes.

Figures 1, 14:
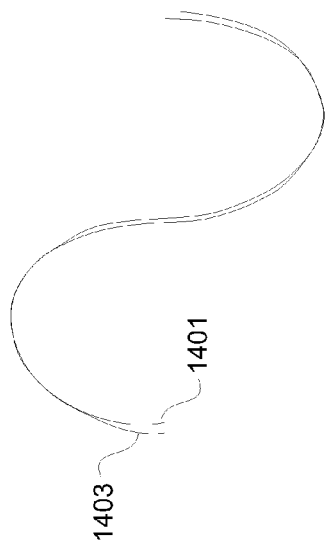
Figures 2, 14:
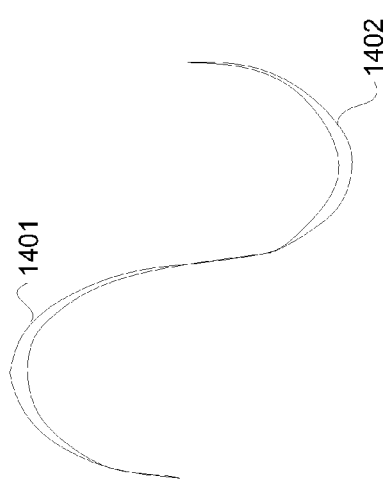
Figures 3, 14:
Figures 4, 14:

FIGS. 14-1 through 14-4 are respective signal diagrams depicting various exemplary signals or tones. FIG. 14-1 includes an ideal sinusoid tone 1401 and a sinusoid tone 1402 with an amplitude error, where sinusoid tones 1401 and 1402 are in-phase with one another. An error signal 1405 for FIG. 14-1 is indicated in FIG. 14-3. Thus, an amplitude error may generate an error signal 1405 that is in-phase with an ideal sinusoid tone 1401. FIG. 14-2 includes an ideal sinusoid tone 1401 and a sinusoid tone 1403 with a timing error, where sinusoid tone 1403 is slightly out-of-phase, with respect to ideal sinusoid tone 1401 at various points over the cycle—most notably the zero crossings. An error signal 1406 for FIG. 14-2 is indicated in FIG. 14-4. Thus, a timing error may generate an error signal 1406 that is phase shifted by 90 degrees with respect to ideal sinusoid tone 1401. From FIGS. 14-1 and 14-4, it should be understood that in principle timing and amplitude errors may be decoupled using additional phase information provided by a lock-in embodiment. For identified amplitude errors, a control block, such as controller 517, and a control system, such as calibration system 520, may be configured to encompass a scaled current correction as in U.S. Pat. No. 7,466,252 B1.

As described above, phase relationship of a spur which is produced over a cycle of codes may be determined. This determination in an embodiment is not the product of an isolated switch of a DAC being modulated. Along those lines, information may be used to actively correct errors at a system level (DAC level) in contrast to a less targeted measurement system that corrects errors at the current steering cell level.

Figure 15:
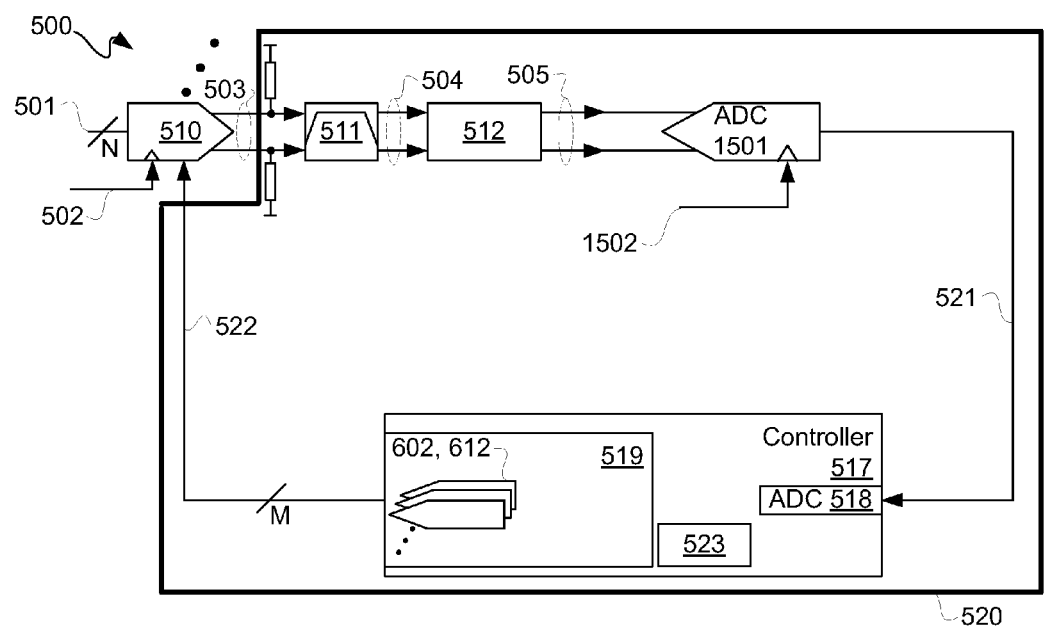
FIG. 15 is a block diagram depicting still yet another exemplary correction system.

FIG. 15 is a block diagram depicting still yet another exemplary correction system 500. Correction system 500 is a sub-sampling loopback embodiment. Loopback may be an entirely internal loopback, such as within a same die or within as same multi-die package. For example, loopback may be for DACs on one die and analog-to-digital converters ("ADCs") on another die in a same SSIT package. Correction system 500 includes calibration system 520, as well as a DAC 510, such as a CS-DAC 510 for example, coupled to calibration system 520 to be calibrated, as previously described though with the following differences. Again as previously described and described below in additional detail, one or more timing errors in analog output 503 of CS-DAC 510 may be characterized by measuring spurious components in the frequency domain of analog output 503. These errors may then be corrected by adjusting the timing of switching events inside CS-DAC 510.

In correction system 500 of FIG. 15, mixer 513, local oscillator 514, filter 515, and detector 516 are all replaced with an analog-to-digital converter ("ADC") 1501 coupled to receive a clock signal 1502 at a frequency $F_{adc}$. ADC 1501 may be on a separate die from DACs 510. A differential output 505 of amplifier 512 is provided as an input to ADC 1501. ADC 1501 provides an ADC digital output 521 to an ADC input port 518 of controller 517.

ADC 1501, responsive to clock signal 1502, may be operated for sub-sampling. A high-speed ADC 1501 directly sampling amplifier output 505 may be used in another embodiment, but such a system may not achieve the same resolution as a sub sampling embodiment. An ADC 1501 operating in a sub-sampling mode effectively beats an input signal with a sample rate, $F_{adc}$, of ADC 1501. Such beating may produce a resulting signal that effectively falls within a conversion bandwidth of ADC 1501, provided that the bandwidth of a spurious tone is smaller than the bandwidth of ADC 1501. ADC sample rate may be selected with respect to a spurious signal according to a coherent sampling criterion.

Returning to an array of DACs 510, an array of ADCs 1501 may be present on such a die. Along those lines, using a loopback configuration of a single DAC 510 and ADC 1501 combination, all other DACs 510 may be measured and calibrated simultaneously using remaining corresponding ADCs 1501.

With the above-description borne in mind, a high-performance DAC may be constructed from an array of time interleaved DACs 510. Using the above-description, a DAC 510 within such a high-performance DAC may have any of its timing errors corrected before proceeding to correct remaining DACs 510 in such array as a whole. Where an individual DAC 510 may be used to synthesize a sinusoidal tone in isolation and be corrected therefor, an array of time interleaved DACs 510 may operate in concert producing a tone where timing errors between DACs 510 may be reduced or optimized. In other words, measurement and correction of timing errors between DACs 510 in such an array may proceed on a time interleaved basis.

Figure 16:
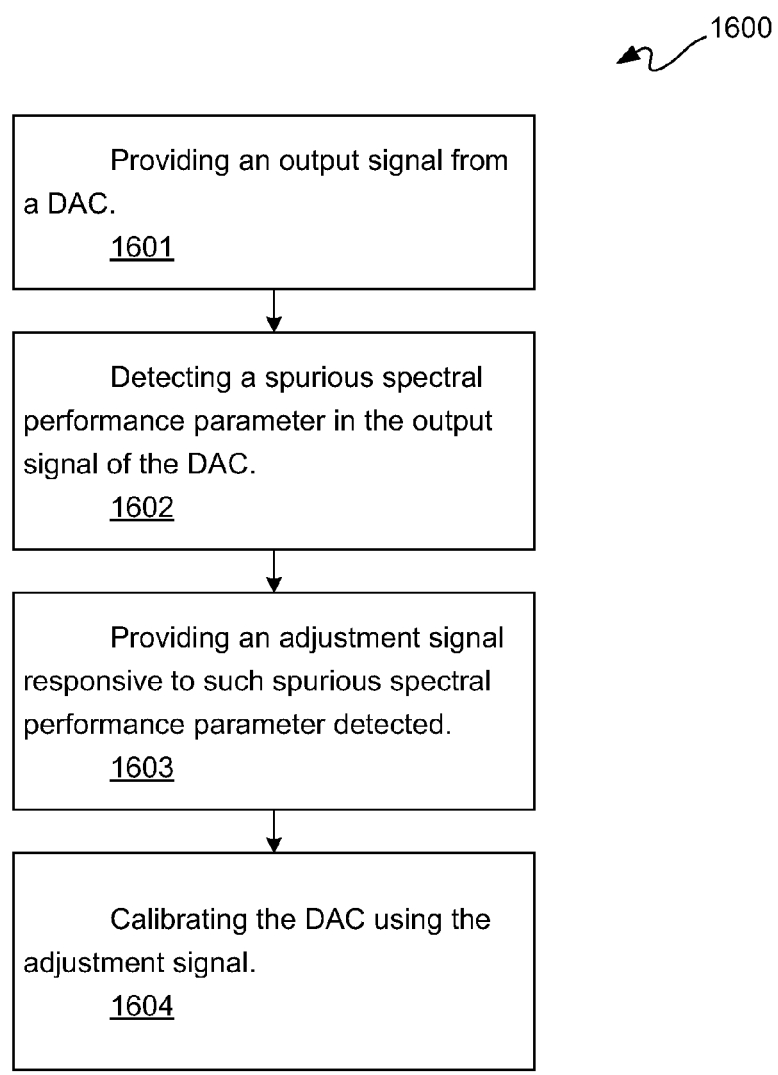
FIG. 16 is a flow diagram depicting a calibration.

FIG. 16 is a flow diagram depicting a calibration flow 1600 in accordance with the above-description. With simultaneous reference to FIGS. 5 through 16, calibration flow 1600 is further described.

Calibration flow 1600 relates generally to calibration of a signal converter. At 1601, an analog output signal 503 is provided from a DAC 510. A spurious spectral performance parameter, such as for example a spur as previously described, is detected at 1602 in such analog output signal 503 of DAC 510. Such detection may be after processing analog output signal 503, as previously described. Again, such spurious spectral performance parameter is sensitive to a timing error associated with DAC 510. An adjustment signal 522 responsive to such spurious spectral performance parameter detected is provided at 1603. Adjustment signal 522 is provided to DAC 510 from at least one other DAC, such as DAC 602 and/or 612, to correct such timing error of DAC 510 to calibrate DAC 510. At 1604, DAC 510 is calibrated using adjustment signal 522.

While the foregoing describes exemplary embodiments, other and further embodiments in accordance with the one or more aspects may be devised without departing from the scope thereof, which is determined by the claims that follow and equivalents thereof. Claims listing steps do not imply any order of the steps. Trademarks are the property of their respective owners.

What is claimed is:

1. An apparatus, comprising:
   a first digital-to-analog converter ("DAC");
   a calibration system coupled to an output port of the first DAC;
   wherein the calibration system includes a second DAC;
   wherein the calibration system is configured to provide an adjustment signal responsive to a spurious spectral performance parameter in an output of the first DAC;
   wherein the spurious spectral performance parameter is sensitive to a timing error associated with the first DAC; and
   wherein the calibration system is coupled to provide the adjustment signal to the first DAC to correct the timing error of the first DAC.

2. The apparatus according to claim 1, wherein the first DAC is a current-steering DAC.

3. The apparatus according to claim 1, wherein the calibration system is configured for heterodyning to provide a detection signal in order to provide the adjustment signal responsive to amplitude of the spurious spectral performance parameter.

4. The apparatus according to claim 1, wherein the calibration system is configured to transform the output of the first DAC to provide an input to a spectrum analyzer to provide a detection signal in order to provide the adjustment signal responsive to amplitude of the spurious spectral performance parameter.

5. The apparatus according to claim 1, wherein the output of the first DAC is differential.

6. The apparatus according to claim 1, wherein the output of the first DAC is single-ended.

7. The apparatus according to claim 1, wherein the calibration system is configured to generate a first detector output and a second detector output to provide the adjustment signal responsive to amplitude and phase of the spurious spectral performance parameter.

8. The apparatus according to claim 1, wherein the calibration system is configured to generate a first detector output and a second detector output to provide the adjustment signal responsive to amplitude of the spurious spectral performance parameter.

9. The apparatus according to claim 1, wherein the calibration system comprises an analog-to-digital converter ("ADC") coupled to receive a filtered and amplified version of the output of the first DAC to generate a digital signal to provide the adjustment signal responsive to amplitude of the spurious spectral performance parameter.

10. The apparatus according to claim 9, wherein:
    the ADC is on a first die; and
    the first DAC is on a second die coupled to the first die in a same package.

11. The apparatus according to claim 1, wherein the calibration system comprises a local oscillator.

12. The apparatus according to claim 11, wherein the local oscillator includes a third DAC.

13. The apparatus according to claim 1, wherein the first DAC is a DAC of an array of DACs.

14. The apparatus according to claim 1, wherein:
    the first DAC includes a driver; and
    the adjustment signal is for adjusting swing of the driver.

15. The apparatus according to claim 1, wherein:
    the first DAC includes a switch; and
    the adjustment signal is for adjusting a well potential of the switch.

16. A method, comprising:
    providing an output signal from a first digital-to-analog converter ("DAC");
    providing an adjustment signal responsive to a spurious spectral performance parameter in the output signal of the first DAC;
    wherein the spurious spectral performance parameter is sensitive to a timing error associated with the first DAC;
    wherein the adjustment signal is provided to the first DAC to correct the timing error of the first DAC; and
    calibrating the first DAC using the adjustment signal.

17. The method according to claim 16, further comprising detecting the spurious spectral performance parameter in the output signal, wherein the detecting of the spurious spectral performance parameter is for detection of spur amplitude.

18. The method according to claim 16, further comprising detecting the spurious spectral performance parameter in the output signal, wherein the detecting of the spurious spectral performance parameter is for detection of spur amplitude and phase.

19. The method according to claim 16, further comprising detecting the spurious spectral performance parameter in the output signal, wherein the detecting of the spurious spectral performance parameter includes heterodyning.

20. The method according to claim 16, further comprising detecting the spurious spectral performance parameter in the output signal, wherein the detecting of the spurious spectral performance parameter includes analog-to-digital conversion.

* * * * *